US006566807B1

(12) United States Patent
Fujita et al.

(10) Patent No.: US 6,566,807 B1
(45) Date of Patent: May 20, 2003

(54) ORGANIC ELECTROLUMINESCENT ELEMENT AND PRODUCTION METHOD THEREOF

(75) Inventors: Yoshimasa Fujita, Kashihara (JP); Takashi Ogura, Nara (JP); Akihiko Kouno, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/472,018

(22) Filed: Dec. 27, 1999

(30) Foreign Application Priority Data

Dec. 28, 1998 (JP) .......................... 10-373865

(51) Int. Cl.[7] .............................................. H05B 33/14
(52) U.S. Cl. ........................ 313/506; 313/504; 428/690; 428/917; 445/24
(58) Field of Search ................................ 313/504, 505, 313/506; 428/690, 917

(56) References Cited

U.S. PATENT DOCUMENTS

| | | | | |
|---|---|---|---|---|
| 5,256,945 A | * | 10/1993 | Imai et al. .............. | 252/301.16 |
| 5,759,444 A | * | 6/1998 | Enokida et al. ......... | 252/301.16 |
| 5,858,562 A | * | 1/1999 | Utsugi et al. ................ | 313/504 |
| 5,869,199 A | * | 2/1999 | Kido ............................ | 313/502 |
| 5,989,737 A | * | 11/1999 | Xie et al. .................... | 428/690 |
| 6,013,384 A | * | 1/2000 | Kido et al. .................. | 313/504 |
| 6,121,727 A | * | 9/2000 | Kanai et al. ................. | 313/504 |
| 6,150,042 A | * | 11/2000 | Tamano et al. ............. | 313/504 |

FOREIGN PATENT DOCUMENTS

| EP | 0 498 979 | 8/1992 |
|---|---|---|
| JP | 10270171 | * 10/1998 |

OTHER PUBLICATIONS

"Low Voltage Organic Light Emitting Diodes Featuring Doped Phthalocyanine as Hole Transport Material", XP-000774933, Blochwitz et al., Jun. 1998, pp. 729–731.
"Doped Organic Light Emitting Diodes Having a 650–nm–Thick Hole Transport Layer", Yamamori et al., XP-000754421, Apr. 1998, pp. 2147–2149.
Unexamined Japanese Patent Publication No. Hei 4(1992)–297076.
"Appl. Phys. Lett", 56(9), Feb. 26, 1990.

* cited by examiner

Primary Examiner—Vip Patel
Assistant Examiner—Sikha Roy
(74) Attorney, Agent, or Firm—Nixon & Vanderhye P.C.

(57) ABSTRACT

An organic electroluminescent element comprising at least a light emitting layer containing an organic light emitting material placed between an anode and a cathode, wherein the element has, between the anode and the light emitting layer, at least a hole transporting layer containing a hole transporting material and an acceptor, and an electron injection restraining layer restraining the injection of electrons from the light emitting layer into the hole transporting layer, from the anode side, and/or, between the light emitting layer and the cathode, at least an electron transporting layer containing an electron transporting material and a donor, and a hole injection restraining layer restraining the injection of holes from the light emitting layer into the electron transporting layer, from the cathode side.

13 Claims, 2 Drawing Sheets

ORGANIC ELECTROLUMINESCENT ELEMENT AND PRODUCTION METHOD THEREOF

CROSS-REFERENCE TO RELATED APPLICATION

This application is related to Japanese application No. HEI 10 (1998)-373865 filed on Dec. 28, 1998, whose priority is claimed under 35 USC §119, the disclosure of which is incorporated by reference in its entirety.

BACKGROUND OF THE INVENTION

1. Field of the Invention

The present invention relates to an organic electroluminescent element (organic EL element) and a production method thereof. More specifically, the invention relates to an organic EL element used for a display, etc., and to a production method thereof.

2. Background of the Invention

Recently, with the highly informational increase, a need of a low electric power consuming and light-weight display element thinner than then CRT for a full color flat display has been increased. As the display element of this kind, a non-spontaneous light-emitting type liquid crystal display (LCD), a spontaneous light-emitting type plasma display (PDP), an EL display, etc., are known.

In the above-described display elements, the EL display is classified into two types of (1) an intrinsic EL element exciting a material (light emitting material) constituting a light emitting layer by the local transfer of electrons or holes in the light emitting layer and emitting light by an alternating current electric field and (2) a charge-injection type EL element exciting a light emitting material by the injection of electrons and holes from an electrode and the recombination of them in a light emitting layer and emitting light by a direct current electric field, from the differences in the light-emitting exciting mechanisms and the constituting materials.

For the intrinsic EL element of above-described (1), a light emitting material made of an inorganic material is generally used and for the EL light emitting element of an injection type of above-described (2), a light emitting material made of an organic material is generally used. That is, there are relations that intrinsic EL element=inorganic EL element and charge injection type EL element=organic EL element.

In these elements, a display using, particularly, the organic EL element is being watched with extremely interest because the display has the features that the display is a spontaneous light emitting type, a low electric power consumption can be realized, the light-emitting color is various, etc.

Hitherto, as an example of the construction of the organic EL element, an element having a three-layer structure shown in FIG. 13 of the accompanying drawings is well known ("Appl. Phys. Lett.", 56(9), Feb. 26, 1990). The organic EL element of prior art shown in FIG. 13 has the construction that on a transparent substrate 1 such as a glass are successively laminated an anode 2 made of an electrode material having a large work function, such as indium-tin oxide (ITO), a hole transporting layer 3 containing a hole transporting material 13, a light emitting layer 52, an electron transporting layer 7 containing an electron transporting material 17, and a cathode 8 made of an electrode material having a small work function, such as Mg/Ag. In the organic EL element, a voltage is applied between the electrodes 2 and 8 to inject electrons and holes in the light emitting layer 52, and by releasing the recombination energy of an electron-hole pair formed in the light emitting layer as a fluorescence or a phosphorescence, a light is emitted.

As a method of producing such an organic EL element, a dry process such as a vacuum vapor-deposition method of forming film on a substrate by heat-sublimating organic materials constituting the organic EL element in vacuum and a wet process such as a Langmuir-Blodgett method (LB method) of spreading an organic material on a liquid surface as a thin film and transferring the film onto a substrate and a spin-coating method of preparing a solution by dissolving an organic material in a solvent and spin-coating the solution by dropping the solution onto a substrate, etc., are known.

However, because a coloring material used for each of the organic layers (a hole transporting layer, a light emitting layer, and an electron transporting layer) in the organic El element has the absorption ends from a visible light region to a ultraviolet region, the band gap is 1.5 eV or higher and there scarcely exists a carrier in the inside of each organic layer at room temperature. Also, the mobility of the carrier moving in the coloring material is generally small.

By these reasons, the electric resistances of the organic layers are very high. The high-resistance characteristics of the organic layers cause voltage lowering of the element and generation of a Joule's heat and further by the causes, there occurs a problem that the light emitting efficiency and the life are lowered.

As a method of solving the problem, a method of improving the electric conductivities of the organic layers by increasing the concentration of the carrier in the inside of the hole transporting layer and the electron transporting layer in a thermal equilibrium state by doping the hole transporting layer with an acceptor 23 and the electron transporting layer with a donor 27 is proposed as shown in Japanese Unexamined Patent Publication No. HEI 4 (1992)-2907076 (FIG. 14).

However, in the above-described method, the electric conductivities of the organic layers can be improved but the carrier cannot be sufficiently confined. As the result thereof, there are problems that the light emitting efficiency is lowered and with the increase of the leaked electric current by a reverse bias, the rectification characteristics become worse.

As described above, the organic EL element strongly suggests the possibility as a full color flat panel display element of the next generation but in the production of the practical element, there are problems which must be solved.

SUMMARY OF THE INVENTION

The present invention has been made for solving the above-described problems and an object of this invention is to provide an organic electroluminescent element of the construction having lowered resistances of organic layers, having a high light emitting efficiency, and being excellent in electrooptical characteristics and also to provide a production method of the organic electroluminescent element.

That is, according to an aspect of this invention, there is provided an organic electroluminescent element comprising at least a light emitting layer containing an organic light emitting material placed between an anode and a cathode, wherein the element has, between the anode and the light emitting layer, at least a hole transporting layer containing a hole transporting material and an acceptor, and an electron injection restraining layer restraining the injection of electrons from the light emitting layer into the hole transporting layer, from the anode side, and/or, between the light emitting layer and the cathode, at least an electron transporting layer containing an electron transporting material and a donor, and a hole injection restraining layer restraining the injection of holes from the light emitting layer into the electron transporting layer, from the cathode side.

Furthermore, according to another aspect of this invention, there is provided a method of producing the above-described organic electroluminescent element comprising forming each of the anode, the hole transporting layer, the electron injection restraining layer, the light emitting layer, the hole injection restraining layer, the electron transporting layer, and the cathode by a vacuum film-forming method.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
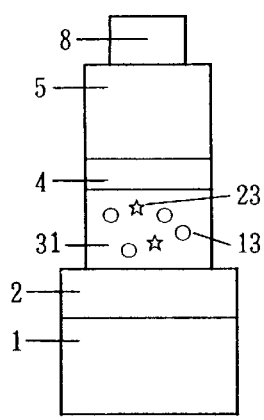
FIG. 1 is a schematic cross-sectional view showing an organic EL element by the 1st embodiment of this invention.

Then, the invention is described in detail.

First, as an organic EL element, there are, for example, the following constructions.

(A) Anode/hole transporting layer/light emitting layer/cathode.

(B) Anode/light emitting layer/electron transporting layer/cathode.

(C) Anode/hole transporting layer/light emitting layer/electron transporting layer/cathode.

In the above-described constructions, in the organic EL elements of (A) and (C), by doping the hole transporting layer with an acceptor, the concentration of the carriers of the hole transporting layer in the thermal equilibrium state is increased and as the result thereof, the electric conductivity of the hole transporting layer is improved, whereby the resistance of the element can be lowered.

However, at applying a regular bias, because in general, the electron affinity of an acceptor is larger than that of a hole transporting material contained in the hole transporting layer, the height of the energy barrier between the hole transporting layer and the light emitting layer making a role of confining electrons in the light emitting layer is reduced. Thus, electrons cannot be efficiently confined in the light emitting layer and the recombination possibility of electrons and holes is lowered. As the result thereof, the light emitting efficiency is lowered.

For solving the problem, in this invention, the electron injection restraining layer is formed between the hole transporting layer and the light emitting layer. By the existence of the electron injection restraining layer, the height of the energy barrier making a role of confining electron in the light emitting layer can be more increased than the case of directly contacting the hole transporting layer and the light emitting layer. Accordingly, electrons can be effectively confined in the light emitting layer and in spite of that an acceptor is doped in the hole transporting layer, a high light emitting efficiency can be obtained.

Also, at applying a reverse bias, because the electron affinity of the acceptor is larger than that of the hole transporting layer, electrons are easily injected by the acceptor from the anode. Also, by easily injecting electrons into the light emitting layer from the acceptor, a leak current is increased.

On the other hand, by forming the electron injection restraining layer between the hole transporting layer and the light emitting layer as in this invention, the restraint of the injection of electrons into the light emitting layer becomes possible, whereby the occurrence of a leak current can be restrained.

That is, in this invention, the organic EL element having a low resistance and a high light emitting efficiency and being excellent in the rectification characteristics can be realized.

For the electron injection restraining layer, a known hole transporting material can be used. More preferably, to more effectively confine electrons in the light emitting layer, it is preferred that the electron affinity $Ea^{(EBL)}$ of a material constituting the electron injection restraining layer, the electron affinity $Ea^{(A)}$ of an acceptor, and the electron affinity $Ea^{(EM)}$ of a material (organic light emitting material) constituting the light emitting layer meet the following relation formula (1)

$$|Ea^{(A)}| \geq |Ea^{(EBL)}| \text{ and } |Ea^{(EM)}| \geq |Ea^{(EBL)}| \tag{1}$$

In this case, when the absolute value ($|Ea^{(A)}|$) of the electron affinity of the acceptor is smaller than the absolute value ($|Ea^{(EM)}|$) of the electron affinity of the light emitting material ($|Ea^{(A)}| < |Ea^{(EM)}|$), it becomes important that the absolute value ($|Ea^{(EBL)}|$) of the electron affinity of the material constituting the electron injection restraining layer meets the former relation of the above-described formula. On the other hand, when the absolute value ($|Ea^{(A)}|$) of the electron affinity of the acceptor is larger than the absolute value ($|Ea^{(EM)}|$) of the electron affinity of the light emitting material ($|Ea^{(A)}|>|Ea^{(EM)}|$), it becomes important that the absolute value ($|Ea^{(EBL)}|$) of the electron affinity of the material constituting the electron injection restraining layer meets the latter relation of the above-described formula. Furthermore, when the absolute value ($|Ea^{(A)}|$) of the electron affinity of acceptor is the same as the absolute value ($|Ea^{(EM)}|$) of the electron affinity of the light emitting material ($|Ea^{(A)}|=|Ea^{(Em)}|$), it becomes important that the absolute value ($|Ea^{(EBL)}|$) of the electron affinity of the material constituting the electron injection restraining layer meets both the relations of the above-described formula.

Also, because when the kinds of the materials used for the organic EL element are reduced, the material cost is more reduced, it is preferred to use the same material as the hole transporting material used for the hole transporting layer as the material of constituting the electron injection restraining layer.

Furthermore, it is preferred the thickness of the electron injection restraining layer is thinner than 30 nm. This is because, if the thickness is 30 nm or thicker, the electron injection restraining layer acts as a resistance, the improvement of the electric conductivity of the hole transporting layer side by doping the acceptor is not remarkably obtained. In addition, the thickness of the electron injection restraining layer is more preferably from 5 to 20 nm.

Then, in the above-described constitutions, in the organic EL elements of (A) and (B), by doping the electron transporting layer with a donor, the carrier concentration of the electron transporting layer in the thermal equilibrium state is increased and as the result thereof, the electric conductivity of the electron transporting layer is improved. Consequently, lowering of the resistance of the element is realized.

However, at applying a regular bias, because the ionization potential of the donor is smaller than that of the electron transporting material contained in the electron transporting layer, the height of the energy barrier between the light emitting layer and the electron transporting layer making a role of confining holes in the light emitting layer becomes small. Thus, holes cannot be effectively confined in the light emitting layer and the recombination possibility of electrons and holes is lowered, and as the result thereof, the light emitting efficiency is lowered.

For solving the problem, in the invention, the hole injection restraining layer is formed between the light emitting layer and the electron transporting layer. By the existence of the hole injection restraining layer, the height of the energy barrier making the role of confining the holes in the light emitting layer can be more increased than the case of directly contacting the electron transporting layer and the light emitting layer. Thus, the holes can be effectively confined in the light emitting layer and in spite of that a donor is doped in the electron transporting layer, a high light emitting efficiency can be obtained.

Also, at applying a reverse bias, because the ionization potential of the donor is smaller than that of the electron transporting material, holes are easily injected by the donor from the cathode. Also, by easily injecting holes from the donor into the light emitting layer, a leak current is increased.

On the other hand, by forming the hole injection restraining layer between the light emitting layer and the electron transporting layer as in this invention, the restraint of the injection of holes into the light emitting layer become possible, whereby the occurrence of the leak current can be restrained.

That is, an organic electroluminescent element having a low resistance and a high light emitting efficiency and being excellent in the rectification characteristics can be realized.

For the hole injection restraining layer, a known electron transporting material can be used. More preferably, for more effectively confining holes in the light emitting layer, it is preferred that the ionization potential $Ip^{(HBL)}$ of the material constituting the hole injection restraining layer, the ionization potential $Ip^{(D)}$ of the donor, and the ionization potential $Ip^{(EM)}$ of the light emitting material meet following relation formula (2)

$$|Ip^{(D)}| \leq |Ip^{(HBL)}| \text{ and } |Ip^{(EM)}| \leq |Ip^{(HBL)}| \qquad (2)$$

In this case, when the absolute value ($|Ip^{(D)}|$) of the ionization potential of the donor is larger than the absolute value ($|Ip^{(EM)}|$) of the ionization potential of the light emitting material ($|Ip^{(D)}|>|Ip^{(EM)}|$), it becomes important that the absolute value ($|Ip^{(HBL)}|$) of the ionization potential of the material constituting the hole injection restraining layer meets the former relation of the above-described formula. On the other hand, when the absolute value ($|Ip^{(D)}|$) of the ionization potential of the donor is smaller than the absolute value ($|Ip^{(EM)}|$) of the ionization potential of the light emitting material ($|Ip^{(D)}|<|IP^{(EM)}|$), it becomes important that the absolute value ($|Ip^{(HBL)}|$) of the ionization potential of the material constituting the hole injection restraining layer meets the latter relation of the above-described formula. Furthermore, when the absolute value ($|Ip^{(D)}|$) of the ionization potential of the donor is the same as the absolute value ($|Ip^{(EM)}|$) of the ionization potential of the light emitting material ($|Ip^{(D)}|=|Ip^{(EM)}|$), it becomes important that the absolute value ($|Ip^{(HBL)}|$) of the ionization potential of the material constituting the hole injection restraining layer meets both the relations of the above-described formula.

Also, because, when the kinds of the materials used for the organic EL element are reduced, the material cost can be reduced, it is preferred to use the material same as the electron transporting material used for the electron transporting layer as the material constituting the hole injection restraining layer.

Also, the thickness of the hole injection restraining layer is preferably thinner than 30 nm. If the thickness is 30 nm or thicker, the hole injection restraining layer acts as a resistance, whereby the improvement of the electric conductivity of the electron transporting layer side by doping the donor does not become remarkable. In addition, the thickness of the hole injection restraining layer is more preferably from 5 to 20 nm.

More practically, in the organic EL element of this invention, there are following constitutions.

(1) Anode/hole transporting layer/electron injection restraining layer/light emitting layer/cathode.

(2) Anode/hole transporting layer/electron injection restraining layer/light emitting layer/electron transporting layer/cathode.

(3) Anode/light emitting layer/hole injection restraining layer/electron transporting layer/cathode.

(4) Anode/hole transporting layer/light emitting layer/hole injection restraining layer/electron transporting layer/cathode.

(5) Anode/hole transporting layer/electron injection restraining layer/light emitting layer/hole injection restraining layer/electron transporting layer/cathode.

Then, the invention is explained by referring to FIGS. 1 to 12. In addition, the above-described constitution (1) includes FIG. 1 and FIG. 2, the constitution (2) includes FIG. 3 and FIG. 4, the constitution (3) includes FIG. 5 and FIG. 6, the constitution (4) includes FIG. 7 and FIG. 8, and the constitution (5) includes FIGS. 9 to 12.

First, FIG. 1 is a schematic cross-sectional view showing the organic EL element by the 1st embodiment of this invention. The organic EL element of FIG. 1 comprises an anode 2 formed on a transparent substrate 1, a hole transporting layer 31 containing at least a hole transporting material 13 and an acceptor 23, an electron injection restraining layer 4, a light emitting layer 5, and a cathode 8. In this case, each of the hole transporting layer 31, the electron injection restraining layer 4, and the light emitting layer 5 may be a single layer or multilayers.

As the transparent substrate 1, a substrate made of a plastic film or sheet of polyester, polymethyl methacrylate, polycarbonate, etc., a quartz sheet, a glass sheet, etc., can be used.

As the material constituting the anode 2, from the view point of efficiently injecting holes in the hole transporting layer, a material having a large work function is preferably used. Practically, a metal oxide such as indium tin oxide (ITO), $SnO_2$, etc., and a metal such as Au, etc., can be used. In this case, the former (metal oxide) can be formed, for example, by a coating-burning method, and the latter (metal) can be formed by a sputtering method, a vacuum vapor-deposition method, etc.

The hole transporting layer 31 contains at least the hole transporting material 13 and the acceptor 23 as described above. The hole transporting layer 31 may be constituted by the hole transporting material 13 and the acceptor 23 only or may further contain additive(s). Also, the hole transporting layer 31 may have a construction that the hole transporting material 13 and the acceptor 23 are dispersed in a high molecular compound or an inorganic compound.

In this case, as the hole transporting material 13, a known material can be used. Practical examples of the hole transporting material used in this invention include inorganic compounds such as p-type hydrogenated amorphous silicon, p-type hydrogenated amorphous silicon carbide, p-type zinc sulfide, p-type zinc selenide, etc.; aromatic amine-base compounds such as N,N'-bis-(3-methylphenyl)-N,N'-bis-(phenyl)-benzidine, N,N'-di(naphthylene-1-yl)-N,N'-bidiphenyl-benzidine), etc.; low-molecular materials such as hydrazone-base compounds, quinacridone-base compounds, phthalocyanine-base compounds, etc.; hole transporting polymers such as polyvinyl carbazole, etc.; π-conjugate system polymers such as poly-p-phenylenevinylene, etc.; and the organic compounds of σ-conjugate polymer materials such as polysilane, etc.

On the other hand, the materials for the acceptor 23 include inorganic materials such as Au, Pt, W, Ir, $POCl_3$, $AsF_6$, Cl, Br, I, etc.; and organic materials, for example, compounds having a cyano group, such as TCNQ (7,7,8,8-tetracyanoquinodimethane), $TCNQF_4$ (tetrafluorotetracyano-quinodimethane), TCNE (tetracyanoethylene), HCNB (hexacyanobutadiene), DDQ (dicyclodicyanobenzoquinone), etc.; compounds having a nitro group, such as TNF (trinitrofluorenone), DNF (dinitrofluorenone), etc.; fluoranil, chloranil, bromanil, etc. In these materials, the compounds having a cyano group, such as TCNQ, $TCNQF_4$, TCNE, HCNB, DDQ, etc., are more preferred.

In addition, the addition ratio of the acceptor to the hole transporting material ($\eta^{(A)}/\eta^{(HTM)}$) is preferably from 1 to 20% by weight.

The hole transporting layer 31 can be formed by a dry process such as a vacuum vapor deposition method, a CVD method, a plasma CVD method, a sputtering method, etc., or a wet process such as a spin coating method, an LB method, etc.

As the material constituting the electron injection restraining layer 4, the hole transporting material 13 described above can be used. The electron injection restraining layer 4 may be constituted by the hole transporting material 13 only but may have a construction that the hole transporting material 13 is dispersed in an inorganic material or an organic material such as a polymer. The electron injection restraining layer 4 can be formed by a dry process such as a vacuum vapor deposition method, a CVD method, a plasma CVD method, a sputtering method, etc., or a wet process such as a spin coating method, an LB method, etc.

The light emitting layer 5 emits a light by the energy released by the recombination of holes moved from the anode 2 through the hole transporting layer 31 and the electron injection restraining layer 4 and electrons injected from the cathode 8. The light emitting layer 5 may be constituted by a light emitting material only or may have a construction that the light emitting material is dispersed in an inorganic material or an organic material such as a polymer.

As the light emitting material, known materials can be used. Practically, fluorescent organic materials such as aromatic dimethylidene compounds, oxadiazole compounds, etc.; fluorescent organometallic compounds such as an azomethine zinc complex, the aluminum complex of 8-hydroxyquinoline, etc.; polymers such as poly-p-phenylenevinylene, etc., can be used. Furthermore, if necessary, the light emitting material may be doped with coumarin-base coloring materials, pyridine-base coloring materials, Rhodamine-base coloring materials, acridine-base coloring materials, and fluorescent coloring materials such as phenoxazone, DCM (4-(dicyanomethylene)-2-(methyl)-6-(4-dimethylaminostyryl)-4-pyran), quinacridone, rubrene, etc. The light emitting layer 5 can be formed by a dry process such as a vacuum vapor deposition method, a CVD method, a plasma CVD method, a sputtering method, etc., or a wet process such as a spin coating method, an LB method, etc.

As the material constituting the cathode 8, from the view point of the injection of electrons into the light emitting layer, a material having a small work function is preferably used. Practically, metals such as aluminum, etc.; alloys such as magnesium-silver, lithium-aluminum, etc., and composite films of magnesium and silver, lithium fluoride and aluminum, etc., can be used. The cathode 8 can be formed by sputtering, a vacuum vapor deposition method, etc.

Figure 2:
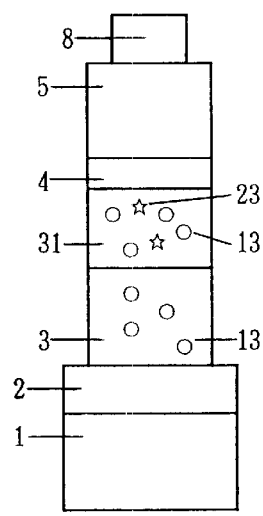
FIG. 2 is a schematic cross-sectional view showing an organic EL element by the 2nd embodiment of this invention.

Then, FIG. 2 is a schematic cross-sectional view showing the organic EL element by the 2nd embodiment of this invention.

The organic EL element of FIG. 2 comprises an anode 2 formed on a transparent substrate 1, a hole transporting layer 3 containing at least a hole transporting material 13 and an acceptor 23, an electron injection restraining layer 4, a light emitting layer 5, and a cathode 8. In this case, each of the hole transporting layers 3 and 31, the electron injection restraining layer 4, and the light emitting layer 5 may be a single layer or multilayers.

As the materials constituting the transparent substrate 1, the anode 2, the hole transporting layer 31, the electron injection restraining layer 4, the light emitting layer 5, and the cathode 8 by the 2nd embodiment of this invention, the same materials as in the 1st embodiment of this invention described above can be used.

The hole transporting layer 3 contains at least the hole transporting material 13 as described above. The hole transporting layer 3 may be constituted by the hole transporting material only or may further contain additive(s). Also, the layer has a construction that the hole transporting material 13 is dispersed in a high molecular compound or an inorganic compound.

In this case, as the hole transporting material 13 contained in the hole transporting layer 3, the hole transporting material 13 contained in the hole transporting layer 31 mentioned above in the 1st embodiment of this invention can be used. The hole transporting layer 3 can be formed by a dry process such as a vacuum vapor deposition method, a CVD method, a plasma CVD method, a sputtering method, etc., or a wet process such as a spin coating method, an LB method, etc.

Figure 3:
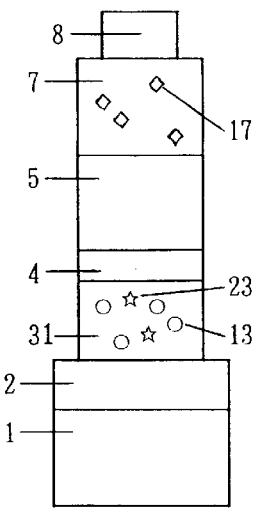
FIG. 3 is a schematic cross-sectional view showing an organic EL element by the 3rd embodiment of this invention.

FIG. 3 is a schematic cross-sectional view showing the organic EL element by the 3rd embodiment of this invention. The organic EL element of FIG. 3 comprises an anode 2 formed on a transparent substrate 1, a hole transporting layer 31 containing at least a hole transporting material 13 and an acceptor 23, an electron injection restraining layer 4, a light emitting layer 5, an electron transporting layer 7 containing at least an electron transporting material 17, and a cathode 8. In this case, each of the hole transporting layer 31, the electron injection restraining layer 4, the light emitting layer 5, and the electron transporting layer 7 may be a single layer or multilayers.

As the materials constituting the transparent substrate 1, the anode 2, the hole transporting layer 31, the electron injection restraining layer 4, the light emitting layer 5, and the cathode 8 by the 3rd embodiment of this invention, the same materials as in the 1st embodiment of this invention described above can be used.

Also, the electron transporting layer 7 contains at least the electron transporting material 17 as described above. The electron transporting layer 7 may be constituted by the electron transporting material 17 only or may further contain additive(s). Also the layer 7 may have a construction that the electron transporting material 17 is dispersed in a high molecular compound or an inorganic compound.

In this embodiment, as the electron transporting material 17, known materials can be used. Practically, inorganic compounds such as n-type hydrogenated amorphous silicon, n-type zinc sulfide, n-type zinc selenide, etc.; metal complex compounds such as the aluminum complex of 8-hydroxyquinoline, etc.; and organic compounds such as triazole-base compounds, oxadiazole-base compounds, xylol-base compounds, etc., can be used.

The electron transporting layer 7 can be formed by a dry process such as a vacuum vapor deposition method, a CVD method, a plasma CVD method, a sputtering method, etc., or a wet process such as a spin coating method, an LB method, etc.

Figure 4:
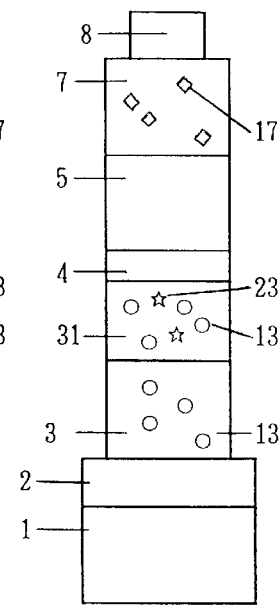
FIG. 4 is a schematic cross-sectional view showing an organic EL element by the 4th embodiment of this invention.

FIG. 4 is a schematic cross-sectional view showing the organic EL element by the 4th embodiment of this invention. The organic EL element of FIG. 4 comprises an anode 2 formed on a transparent substrate 1, a hole transporting layer 3 containing at least a hole transporting material 13, a hole transporting layer 31 containing at least a hole transporting material 13 and an acceptor 23, an electron injection restraining layer 4, a light emitting layer 5, an electron transporting layer 7 containing at least an electron transporting material 17, and a cathode 8. In this case, each of the hole transporting layers 3 and 31, the electron injection restraining layer 4, the light emitting layer 5, and the electron transporting layer 7 may be a single layer or multilayers.

As the materials constituting the transparent substrate 1, the anode 2, the hole transporting layers 3 and 31, the electron injection restraining layer 4, the light emitting layer 5, the electron transporting layer 7 and the cathode 8 by the 4th embodiment of this invention, the same materials as in the 1st to 3rd embodiments of this invention described above can be used.

Figure 5:
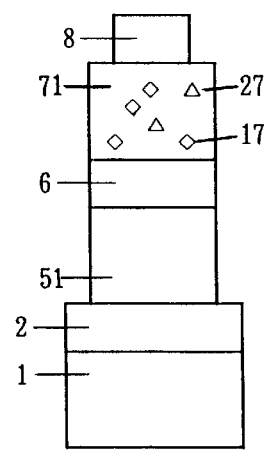
FIG. 5 is a schematic cross-sectional view showing an organic EL element by the 5th embodiment of this invention.

FIG. 5 is a schematic cross-sectional view showing the organic EL element of the 5th embodiment of this invention. The organic EL element of FIG. 5 comprises an anode 2 formed on a transparent substrate 1, a light emitting layer 51, a hole injection restraining layer 6, an electron transporting layer 71 containing at least an electron transporting material 17 and a donor 27, and a cathode 8. In this case, each of the light emitting layer 51, the hole injection restraining layer 6, and the electron transporting layer 71 may be a single layer or multilayers.

Also, as the materials constituting the transparent substrate 1, the anode 2, and the cathode 8 by the 5th embodiment of this invention, the same materials as in the 1st embodiment of this invention described above can be used.

In this embodiment, the light emitting layer 51 emits a light by the energy released by the recombination of the holes injected from the anode 2 and the electrons moved from the cathode 8 through the electron transporting layer 7 and the hole injection restraining layer 6. The light emitting layer 51 may be constituted by the light emitting material only or may have a construction that the light emitting material is dispersed in an inorganic material or an organic material such as a polymer.

As the light emitting material, known materials can be used. Practically, diphenylethylene derivatives, vinyl anthracene derivatives, triphenylamine derivatives, etc., can be used. Furthermore, if necessary, the light emitting material may be doped with coumarin-base coloring materials, pyridine-base coloring materials, Rhodamine-base coloring materials, acridine-base coloring materials, and fluorescent coloring materials such as phenoxazone, DCM, quinacridone, rubrene, etc. The light emitting layer 51 can be formed by a dry process such as a vacuum vapor deposition method, a CVD method, a plasma CVD method, a sputtering method, etc., or a wet process such as a spin coating method, an LB method, etc.

Also, for the hole injection restraining layer 6, the electron transporting material 17 shown in the above-described 3rd embodiment of this invention can be used. Furthermore, the hole injection restraining layer 6 may be constituted by the electron transporting material 17 only or may have a construction that the electron transporting material 17 is dispersed in an inorganic material or an organic material such as a polymer.

The hole injection restraining layer 6 can be formed by a dry process such as a vacuum vapor deposition method, a CVD method, a plasma CVD method, a sputtering method, etc., or a wet process such as a spin coating method, an LB method, etc.

Also, the electron transporting layer 71 contains at least the electron transporting material 17 and the donor 27 as described above. The electron transporting layer 71 may be constructed by the electron transporting material 17 and the donor 27 only or may further contain additive(s). Also the electron transporting layer 71 may have a construction that the electron transporting material 17 and the donor 27 are dispersed in a high molecular compound or an inorganic compound.

In this case, as the electron transporting material 17, the materials shown in the above-described 3rd embodiment of this invention can be used.

On the other hand, the donor 27 includes inorganic materials such as alkali metals, alkaline earth metals, rare earth elements, Al, Ag, Cu, In, etc.; compounds having aromatic tertiary amine as the skeleton, such as anilines, phenylenediamines, benzidines [e.g., N,N,N',N'-tetraphenylbenzidine, N,N'-bis-(3-methylphenyl)-N,N'-bis-(phenyl)-benzidine, and N,N'-di(naphthalene-1-yl)-N,N'-diphenyl-benzidine], triphenylamines [e.g., triphenylamine, 4,4',4"-tris(N,N-diphenyl-amino)-triphenylamine, 4,4',4"-tris(N-3-methylphenyl-N-phenyl-amino)-triphenylamine, and 4,4',4"-tris(N-(1-naphthyl)-N-phenyl-amino)-triphenylamine], triphenyldiamines [e.g., N,N'-di-(4-methyl-phenyl)-N,N'-diphenyl-1,4-phenylenediamine], etc.; condensed polycyclic compounds (which may have a substituent) such as pyrene, perylene, anthracene, tetracene, pentacene, etc.; organic materials such as TTF (tetrathiafurvarene), etc. In these materials, the compounds having an aromatic tertiary amine as the skeleton and the condensed polycyclic compounds are more preferred.

In addition, the addition ratio of the donor to the electron transporting material ($\eta^{(D)}/\eta^{(ETM)}$) is preferably from 1 to 20% by weight.

The electron transporting layer 71 can be formed by a dry process such as a vacuum vapor deposition method, a CVD method, a plasma CVD method, a sputtering method, etc., or a wet process such as a spin coating method, an LB method, etc.

Figure 6:
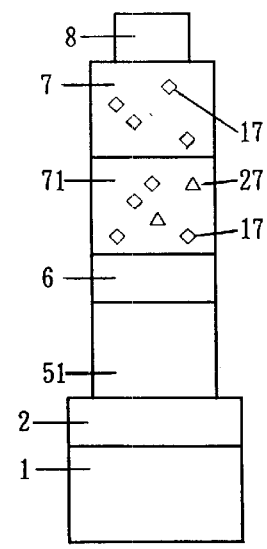
FIG. 6 is a schematic cross-sectional view showing an organic EL element by the 6th embodiment of this invention.

Fig. 6 is a schematic cross-sectional view showing the organic EL element of the 6th embodiment of this invention. The organic EL element of FIG. 6 comprises an anode 2 formed on a transparent substrate 1, a light emitting layer 51, a hole injection restraining layer 6, an electron transporting layer 71 containing at least an electron transporting material 17 and a donor 27, an electron transporting layer 7 containing at least an electron transporting material 17, and a cathode 8. In this case, each of the light emitting layer 51, the hole injection restraining layer 6, and the electron transporting layers 7 and 71 may be a single layer or multilayers.

Also, as the materials constituting the layers of the 6th embodiment, the materials same as those in the 1st, 3rd, and 5th embodiments of this invention described above can be used.

Figure 7:
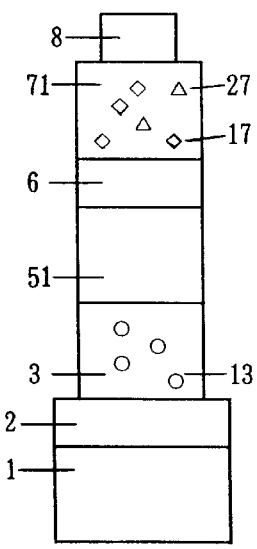
FIG. 7 is a schematic cross-sectional view showing an organic EL element by the 7th embodiment of this invention.

FIG. 7 is a schematic cross-sectional view showing the organic EL element of the 7th embodiment of this invention. The organic EL element of FIG. 7 comprises an anode 2 formed on a transparent substrate 1, a hole transporting layer 3 containing at least a hole transporting material 13, a light emitting layer 51, a hole injection restraining layer 6, an electron transporting layer 71 containing at least an electron transporting material 17 and a donor 27, and a cathode 8. In this case, each of the hole transporting layer 3, the light emitting layer 51, the hole injection restraining layer 6, and the electron transporting layer 71 may be a single layer or multilayers.

As the materials constituting the layers of the 7th embodiment, the materials same as those in the 1st, 2nd, and 5th embodiments of this invention described above can be used.

Figure 8:
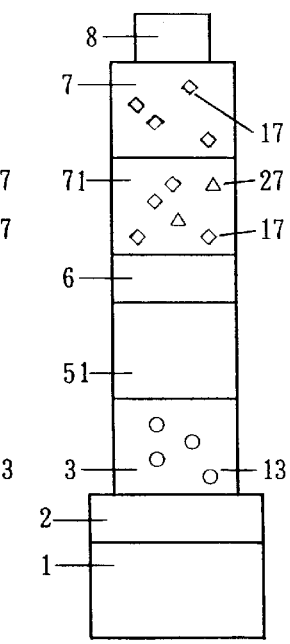
FIG. 8 is a schematic cross-sectional view showing an organic EL element by the 8th embodiment of this invention.

FIG. 8 is a schematic cross-sectional view showing the organic EL element of the 8th embodiment of this invention. The organic EL element of FIG. 8 comprises an anode 2 formed on a transparent substrate 1, a hole transporting layer 3 containing at least a hole transporting material 13, a light emitting layer 51, a hole injection restraining layer 6, an electron transporting layer 71 containing at least an electron transporting material 17 and a donor 27, an electron transporting layer 7 containing at least an electron transporting material 17, and a cathode 8. In this case, each of the hole transporting layer 3, the light emitting layer 51, the hole injection restraining layer 6, the electron transporting layer 71 and the electron transporting layer 7 may be a single layer or multilayers.

As the materials constituting the layers of the 8th embodiment, the materials same as those in the 1st, 2nd, 3rd and 5th embodiments of this invention described above can be used.

Figure 9:
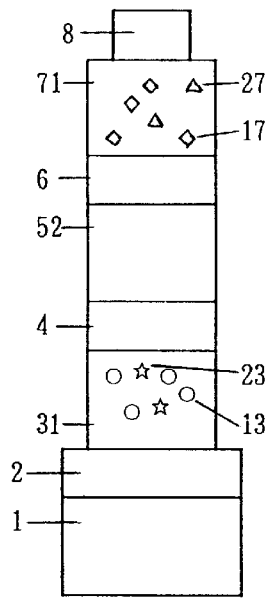
FIG. 9 is a schematic cross-sectional view showing an organic EL element by the 9th embodiment of this invention.

FIG. 9 is a schematic cross-sectional view showing the organic EL element of the 9th embodiment of this invention. The organic EL element of FIG. 9 comprises an anode 2 formed on a transparent substrate 1, a hole transporting layer 31 containing at least a hole transporting material 13 and an acceptor 23, an electron injection restraining layer 4, a light emitting layer 52, a hole injection restraining layer 6, an electron transporting layer 71 containing at least an electron transporting material 17 and a donor 27, and a cathode 8. In this case, each of the hole transporting layer 31, the electron injection restraining layer 4, the light emitting layer 52, the hole injection restraining layer 6, and the electron transporting layer 71 may be a single layer or multilayers.

As the materials constituting the hole transporting layer 31, the electron injection restraining layer 4, the hole injection restraining layer 6, and the electron transporting layer 71 of the 9th embodiment, the materials same as those on the 1st and 5th embodiments of this invention described above can be used.

In this embodiment, the light emitting layer 52 emits a light by the energy released by the recombination of the holes moved from the anode 2 through the hole transporting layer 31 and the electron injection restraining layer 4 and the electrons moved from the cathode 8 through the electron transporting layer 71 and the hole injection restraining layer 6. Also, the light emitting layer 52 may be composed of the light emitting material only or may have a construction that the light emitting material is dispersed in an inorganic material or an organic material such as a polymer. As the light emitting material, the same light emitting materials as in the 1st and 5th embodiments described above can be used. Also, if necessary, the light emitting material may be doped with the fluorescent coloring materials as in the 1st and 5th embodiments described above.

The light emitting layer 52 can be formed by a dry process such as a vacuum vapor deposition method, a CVD method, a plasma CVD method, a sputtering method, etc., or a wet process such as a spin coating method, an LB method, etc.

Figure 10:
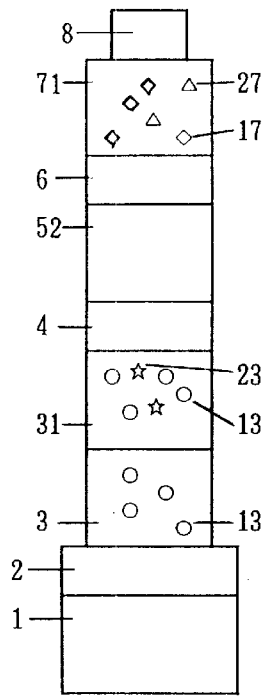
FIG. 10 is a schematic cross-sectional view showing an organic EL element by the 10th embodiment of this invention.

FIG. 10 is a schematic view showing the organic EL element of the 10th embodiment of this invention. The organic EL element of FIG. 10 comprises an anode 2 formed on a transparent substrate 1, a hole transporting layer 3 containing at least a hole transporting material 13, a hole transporting layer 31 containing at least a hole transporting material 13 and an acceptor 23, an electron injection restraining layer 4, a light emitting layer 52, a hole injection restraining layer 6, an electron transporting layer 71 containing at least an electron transporting material 17 and a donor 27, and a cathode 8. In this case, each of the hole transporting layer 3, the hole transporting layer 31, the electron injection restraining layer 4, the light emitting layer 52, the hole injection restraining layer 6, and the electron transporting layer 71 may be a single layer or multilayers.

As the-materials constituting the layers of the 10th embodiment, the materials same as those in the 1st, 2nd, 5th and 9th embodiments of this invention described above can be used.

Figure 11:
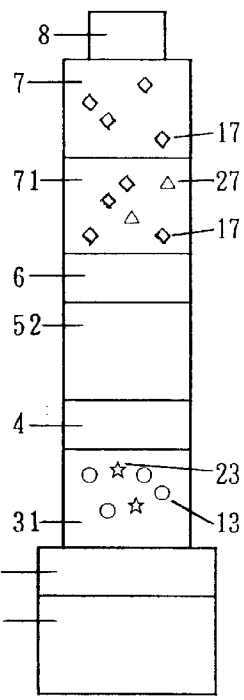
FIG. 11 is a schematic cross-sectional view showing an organic EL element by the 11th embodiment of this invention.

FIG. 11 is a schematic cross-sectional view showing the organic EL element of the 11th embodiment of this invention. The organic EL element of FIG. 11 comprises an anode 2 formed on a transparent substrate 1, a hole transporting layer 31 containing at least a hole transporting material 13 and an acceptor 32, an electron injection restraining layer 4, a light emitting layer 52, a hole injection restraining layer 6, an electron transporting layer 71 containing at least an electron transporting material 17 and a donor 27, an electron transporting layer 7 containing at least an electron transporting material 17, and a cathode 8. In this case, each of the hole transporting layer 31, the electron injection restraining layer 4, the light emitting layer 52, the hole injection restraining layer 6, the electron transporting layer 71, and the electron transporting layer 7 may be a single layer or multilayers.

As the materials constituting the layers of the 11th embodiment, the materials same as those in the 1st, 3rd, 5th and 9th embodiments of this invention described above can be used.

Figure 12:
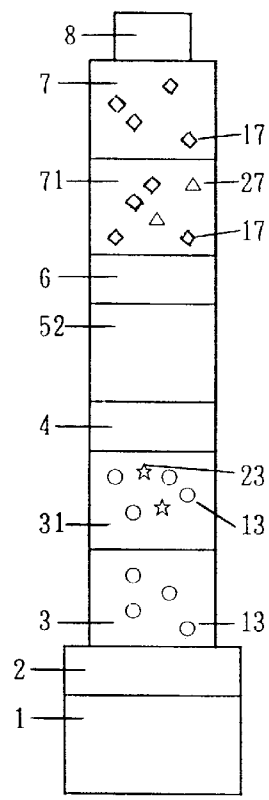
FIG. 12 is a schematic cross-sectional view showing an organic EL element by the 12th embodiment of this invention.
Figure 13:
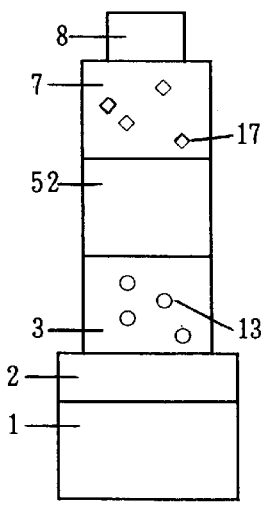
FIG. 13 is a schematic cross-sectional view showing an organic EL element of prior art having a 3 layer structure.
Figure 14:
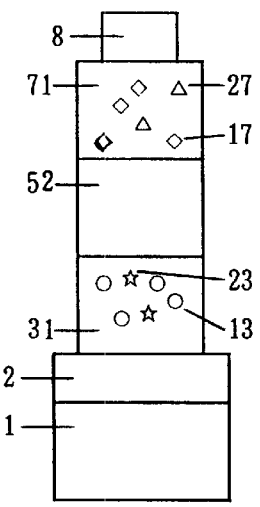
FIG. 14 is a schematic cross-sectional view showing an organic EL element of prior art doped with an acceptor and a donor.

FIG. 12 is a schematic cross-sectional view showing the organic EL element of the 12th embodiment of this invention. The organic EL element of FIG. 12 comprises an anode 2 formed on a transparent substrate 1, a hole transporting layer 3 containing at least a hole transporting material 13, a hole transporting layer 31 containing at least a hole transporting material 13 and an acceptor 23, an electron injection restraining layer 4, a light emitting layer 52, a hole injection restraining layer 6, an electron transporting layer. 71 containing at least an electron transporting material 17 and a donor 27, an electron transporting layer 7 containing at least an electron transporting material 17, and a cathode 8. In this case, each of the hole transporting layer 3, the hole transporting layer 31, the electron injection restraining layer 4, the light emitting layer 52, the hole injection restraining layer 6, the electron transporting layer 71, and the electron transporting layer 7 may be a single layer or multilayers.

As the materials constituting the layers of the 12th embodiment, the materials same as those in the 1st, 2nd, 3rd, 5th and 9th embodiments of this invention described above can be used.

In addition, in the organic EL element having the three-layer structure that the hole transporting layer, the light emitting layer, and the electron transporting layer are placed between the anode and the cathode, the hole transporting layer having a lower hole transporting faculty or the electron transporting layer having a lower electron transporting faculty dominates the resistance as the element. Therefore, when the hole transporting faculty of the hole transporting layer is lower, the resistance as the element can be reduced by doping the hole transporting layer with the acceptor and when the electron transporting faculty of the electron transporting layer is lower, the resistance as the element can be reduced by doping the electron transporting layer with the donor. Particularly, it is better that both the hole transporting layer and the electron transporting layer are doped with the acceptor and the donor respectively. In this case, both effects of the element wherein the hole transporting layer is doped with the acceptor and the electron transporting layer is doped with the donor can be obtained.

Then, the following examples are intended to illustrate the present invention in detail but not to limit the invention in any way.

(1) When a hole transporting layer is doped with the acceptor:

(1-1) Preparation of organic EL element having a two-layer structure (hole transporting layer+light emitting layer):

Comparative Example 1

A transparent substrate having formed on the surface thereof an indium-tin oxide (ITO) layer having a surface resistance of 10 Ω/ and an area of 50 mm square was used, the ITO layer was patterned into stripes of 2 mm in width, after washing it with water, the substrate was subjected to pure-water ultrasonic washing for 10 minutes, acetone ultrasonic washing for 10 minutes, and isopropyl alcohol vapor washing for 5 minutes, and dried at 100° C. for one hour. Then, the substrate was fixed to a substrate holder in a resistance-heating vapor deposition apparatus and the apparatus was evacuated to a vacuum of $1 \times 10^{-4}$ Pa or lower. In addition, the patterned ITO layer is used as an anode.

Thereafter, as a hole transporting layer, N,N'-di(naphthylene-1-yl)-N,N'-bidiphenyl-benzidine (hereinafter, is referred to as simply NPD) shown by following structural formula (1) was laminated on the substrate at a vapor deposition rate of 0.4 nm/second such that the film thickness became 100 nm.

Then, as a light emitting layer, tris(8-hydroxyquinolinato) aluminum (hereinafter, is referred to as simply $Alq_3$) shown by following structural formula (2) was laminated on the hole transporting layer at a vapor deposition rate of 0.2 nm/second such that the film thickness-became 50 nm.

Finally, a cathode made of LiF—Al was formed by laminating LiF on the light emitting layer at a vapor deposition rate of 0.02 nm/second such that the film thickness became 1 nm and by laminating Al on the LiF film at a vapor deposition rate of 0.6 nm/second such that the film thickness became 100 nm.

Thus, an organic EL element composed of the anode, the hole transporting layer, the light emitting layer, and the cathode was obtained.

Structural formula (1)

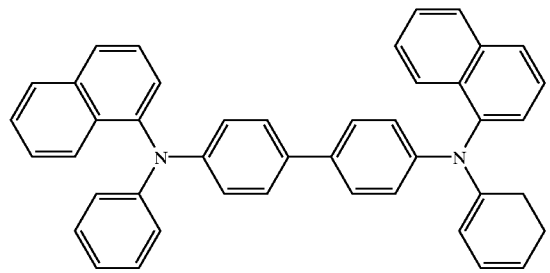

Structural formula (2)

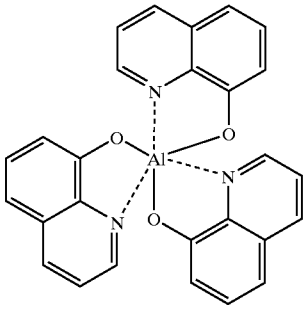

Comparative Example 2

By following the same procedure as Comparative Example 1 except that as a hole transporting layer, each of NPD and 7,7,8,8-tetracyanoquinodimethane (hereinafter, is referred to as simply TCNQ) shown by following structural formula (3) was laminated at vapor deposition rates of 0.4 nm/second and 0.004 nm/second respectively such that the film thickness became 100 nm, an organic EL element was obtained.

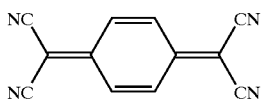

Structural formula (3)

Comparative Example 3

By following the same procedure as Comparative Example 1 except that as a hole transporting layer, each of NPD and hexacyanobutadiene (hereinafter, is referred as simply HCNB) shown by following structural formula (4) was laminated at vapor deposition rates of 0.4 nm/second and 0.04 nm/second respectively such that the film thickness became 100 nm, an organic EL element was obtained.

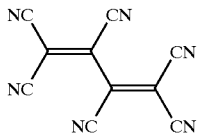

Structural formula (4)

EXAMPLES 1 AND 2

By following the same procedures as Comparative Example 2 (Example 1) and Comparative Example 3. (Example 2) except that between each hole transporting layer and each light emitting layer, as an electron injection restraining layer, NPD was laminated at a vapor deposition rate of 0.4 nm/second such that the film thickness became 10 nm, organic EL elements were obtained.

(1-2) Preparation of an organic EL element having a three-layer structure (hole transporting layer +light emitting layer+electron transporting layer):

Comparative Example 4

A transparent substrate having formed on the surface thereof an indium-tin oxide (ITO) layer having a surface resistance of 10 Ω/ and an area of 50 mm square was used, the ITO film was patterned into stripes of 2 mm in width, after washing it with water, the substrate was subjected to pure-water ultrasonic washing for 10 minutes, acetone ultrasonic washing for 10 minutes, and isopropyl alcohol vapor washing for 5 minutes, and dried at 100° C. for one hour. Then, the substrate was fixed to a substrate holder in a resistance-heating vapor deposition apparatus and the apparatus was evacuated to a vacuum of $1 \times 10^{-4}$ Pa or lower. In addition, the patterned ITO is used as an anode.

Thereafter, as a hole transporting layer, NPD was laminated on the substrate at a vapor deposition rate of 0.4 nm/second such that the film thickness became 100 nm.

Then, as a light emitting layer, bis(2-methyl-8-quinolinolato) (p-phenylphenolato) aluminum (hereinafter, is referred to as simply BAlq) shown by following structural formula (5) was laminated on the hole transporting layer at a vapor deposition rate of 0.2 nm/second such that the film thickness became 20 nm.

Then, as an electron transporting layer, $Alq_3$ was laminated on the light emitting layer at a vapor deposition rate of 0.2 nm/second such that the film thickness became 30 nm.

Finally, a cathode made of LiF—Al was formed by laminating LiF on the light emitting layer at a vapor deposition rate of 0.02 nm/second such that the film thickness became 1 nm and by laminating Al on the LiF layer at a vapor deposition rate of 0.6 nm/second such that the film thickness became 100 nm.

Thus, an organic EL element composed of the anode, the hole transporting layer, the light emitting layer, the electron transporting layer, and the cathode was obtained.

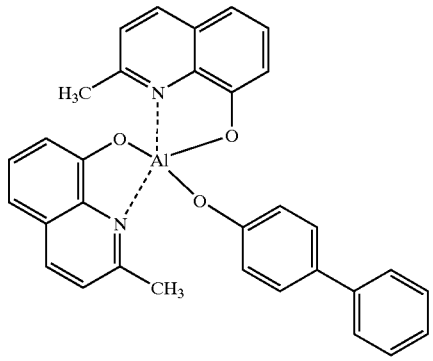

Structural formula (5)

Comparative Example 5

By following the same procedure as Comparative Example 4 except that as a hole transporting layer, each of NPD and TCNQ was laminated at vapor deposition rates of 0.4 nm/second and 0.004 nm/second respective such that the film thickness became 100 nm, an organic EL element was obtained.

EXAMPLE 3

By following the same procedure as Comparative Example 5 except that between the hole transporting layer and the light emitting layer, as an electron injection restraining layer, NPD was laminated at a vapor deposition rate of 0.4 nm/second such that the film thickness became 10 nm, an organic EL element was obtained.

EXAMPLE 4

By following the same procedure as Comparative Example 5 except that between the hole transporting layer and the light emitting layer, as an electron injection restraining layer, copper phthalocyanine (hereinafter, is referred to as simply CuPc) shown by following structural formula (6) was laminated at a vapor deposition rate of 0.4 nm/second such that the film thickness became 10 nm, an organic EL element was obtained.

Structural formula (6)

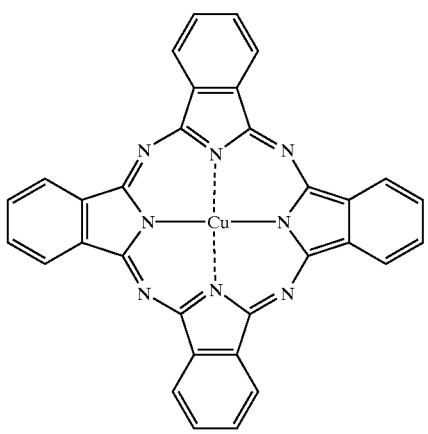

EXAMPLE 5

By following the same procedure as Comparative Example 5 except that between the hole transporting layer and the light emitting layer, as an electron injection restraining layer, 4,4',4''-tris(N-3-methylphenyl-N-phenyl-amino)-triphenylamine (hereinafter, is referred to as simply MTDATA) shown by the following structural formula (7) was laminated at a vapor deposition rate of 0.4 nm/second such that the film thickness became 10 nm, an organic EL element was obtained.

Structural formula (7)

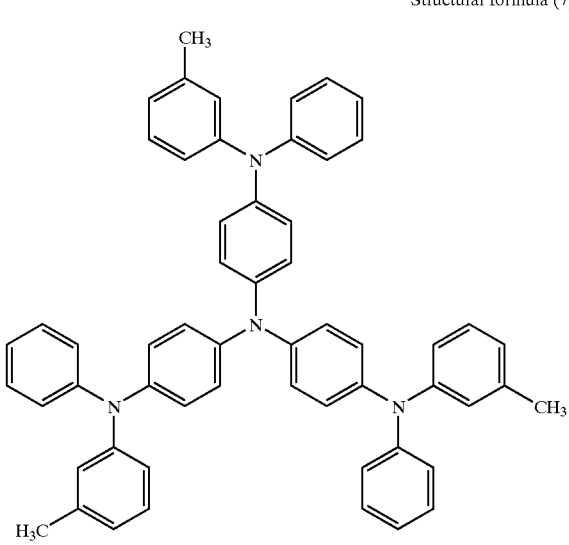

EXAMPLE 6

By following the same procedure as Example 3 except that the electron injection restraining layer was laminated such that the film thickness became 5 nm, an organic EL element was obtained.

EXAMPLE 7

By following the same procedure as Example 3 except that the electron injection restraining layer was laminated such that the film thickness became 20 nm, an organic EL element was obtained.

EXAMPLE 8

By following the same procedure as Example 3 except that the electron injection restraining layer was laminated such that the film thickness became 30 nm, an organic EL element was obtained.

EXAMPLE 9

By following the same procedure as Example 3 except that as the hole transporting layer, each of NPD and TCNQ was laminated at vapor deposition rates of 0.4 nm/second and 0.02 nm/second respectively such that the film thickness became 100 nm, an organic EL element was obtained.

EXAMPLE 10

By following the same procedure as Example 3 except that as the hole transporting layer, each of NPD and TCNQ was laminated at vapor deposition rates of 0.4 nm/second and 0.04 nm/second respectively such that the film thickness became 100 nm, an organic EL element was obtained.

EXAMPLE 11

By following the same procedure as Example 3 except that as the hole transporting layer, each of NPD and TCNQ was laminated at vapor deposition rates of 0.4 nm/second and 0.08 nm/second respectively such that the film thickness became 100 nm, an organic EL element was obtained.

EXAMPLE 12

By following the same procedure as Example 3 except that as a 2nd hole transporting layer, CuPc was laminated between ITO and NPD at vapor deposition rates of 0.2 nm/second such that the film thickness became 15 nm, an organic EL element was obtained.

The constructions of the elements obtained in (1-1) and (1-2) described above are shown in Table 1 below.

TABLE 1

| | Element Constructions | | | | | | Acceptor concentration (wt. %) (*) | Thickness of electron injection retaining layer |
|---|---|---|---|---|---|---|---|---|
| | Hole transporting layer | Hole transporting layer | Acceptor | Electron injection retaining layer | Light emitting layer | Electron transporting layer | | |
| Comparative Example 1 | — | NPD | — | — | Alq$_3$ | — | — | — |

TABLE 1-continued

| | Element Constructions | | | | | | Acceptor concentration (wt. %) (*) | Thickness of electron injection retaining layer |
|---|---|---|---|---|---|---|---|---|
| | Hole transporting layer | Hole transporting layer | Acceptor | Electron injection retaining layer | Light emitting layer | Electron transporting layer | | |
| Comparative Example 2 | — | NPD | TCNQ | — | Alq$_3$ | — | 1 | — |
| Comparative Example 3 | — | NPD | HCNB | — | Alq$_3$ | — | 1 | — |
| Example 1 | — | NPD | TCNQ | NPD | Alq$_3$ | — | 1 | 10 nm |
| Example 2 | — | NPD | HCNB | NPD | Alq$_3$ | — | 1 | 10 nm |
| Comparative Example 4 | — | NPD | — | — | BAlq | Alq$_3$ | — | — |
| Comparative Example 5 | — | NPD | TCNQ | — | BAlq | Alq$_3$ | 1 | — |
| Example 3 | — | NPD | TCNQ | NPD | BAlq | Alq$_3$ | 1 | 10 nm |
| Example 4 | — | NPD | TCNQ | CuPc | BAlq | Alq$_3$ | 1 | 10 nm |
| Example 5 | — | NPD | TCNQ | MIDATA | BAlq | Alq$_3$ | 1 | 10 nm |
| Example 6 | — | NPD | TCNQ | NPD | BAlq | Alq$_3$ | 1 | 5 nm |
| Example 7 | — | NPD | TCNQ | NPD | BAlq | Alq$_3$ | 1 | 20 nm |
| Example 8 | — | NPD | TCNQ | NPD | BAlq | Alq$_3$ | 1 | 30 nm |
| Example 9 | — | NPD | TCNQ | NPD | BAlq | Alq$_3$ | 5 | 10 nm |
| Example 10 | — | NPD | TCNQ | NPD | BAlq | Alq$_3$ | 10 | 10 nm |
| Example 11 | — | NPD | TCNQ | NPD | BAlq | Alq$_3$ | 20 | 10 nm |
| Example 12 | CuPc | NPD | TCNQ | NPD | BAlq | Alq$_3$ | 1 | 10 nm |

(*): $\eta^{(A)}/\eta^{(HTM)}$ (1-3) Measurement of Element Characteristics

By applying a direct current voltage to each of the elements obtained as described above, the current density and the luminance in this case were simultaneously measured. Also, from the measurement results, the light emission efficiency was calculated.

Furthermore, the ionization potential (Ip) (measurement instrument: AC-1, manufactured by Riken Keiki K.K.) and the band gap (Eg) (measurement instrument: U-3410 type self-supporting spectrophotometer, manufactured by Hitachi, Ltd.) were determined and the electron affinity (Ea) was calculated therefrom. From the electron affinity obtained, the height of the energy barrier making a role of confining electrons in the light emitting layer was calculated.

The results are shown in Table 2 below.

TABLE 2

| | Characteristics at current density of 100 mA/cm$^2$ | | | | Electron Affinity (eV) | | | | |
|---|---|---|---|---|---|---|---|---|---|
| | Voltage (V) | Luminance (cd/m$^2$) | Efficiency (cd/A) | Emitted color | Hole transporting material | Acceptor | Electron injection restraining layer | Light emitting material | Height of energy barrier (eV) (*) |
| Comparative Example 1 | 8.3 | 2800 | 2.8 | Green | 2.38 | — | — | 3.10 | 0.72 |

TABLE 2-continued

| | Characteristics at current density of 100 mA/cm² | | | | Electron Affinity (eV) | | | |
|---|---|---|---|---|---|---|---|---|
| | Voltage (V) | Luminance (cd/m²) | Efficiency (cd/A) | Emmitted color | Hole transporting material | Acceptor | Electron injection restraining layer | Light emitting material | Height of energy barrier (eV) (*) |
| Comparative Example 2 | 5.2 | 1500 | 1.5 | Green | 2.38 | 3.21 | — | 3.10 | −0.11 |
| Comparative Example 3 | 6.0 | 1300 | 1.3 | Green | 2.38 | 3.11 | — | 3.10 | −0.01 |
| Example 1 | 6.0 | 2600 | 2.6 | Green | 2.38 | 3.21 | 2.38 | 3.10 | 0.72 |
| Example 2 | 6.2 | 2500 | 2.5 | Green | 2.38 | 3.11 | 2.38 | 3.10 | 0.72 |
| Comparative Example 4 | 13.4 | 780 | 0.78 | Blue | 2.38 | — | — | 3.03 | 0.65 |
| Comparative Example 5 | 9.8 | 360 | 0.36 | Blue | 2.38 | 3.21 | — | 3.03 | −0.18 |
| Example 3 | 10.6 | 700 | 0.70 | Blue | 2.38 | 3.21 | 2.38 | 3.03 | 0.65 |
| Example 4 | 10.4 | 200 | 0.20 | Blue | 2.38 | 3.21 | 3.55 | 3.03 | −0.52 |
| Example 5 | 10.8 | 740 | 0.74 | Blue | 2.38 | 3.21 | 2.11 | 3.03 | 0.92 |
| Example 6 | 10.2 | 680 | 0.68 | Blue | 2.38 | 3.21 | 2.38 | 3.03 | 0.65 |
| Example 7 | 13.0 | 730 | 0.73 | Blue | 2.38 | 3.21 | 2.38 | 3.03 | 0.65 |
| Example 8 | 14.6 | 760 | 0.76 | Blue | 2.38 | 3.21 | 2.38 | 3.03 | 0.65 |
| Example 9 | 9.6 | 680 | 0.68 | Blue | 2.38 | 3.21 | 2.38 | 3.03 | 0.65 |
| Example 10 | 9.5 | 690 | 0.69 | Blue | 2.38 | 3.21 | 2.38 | 3.03 | 0.65 |
| Example 11 | 9.3 | 680 | 0.68 | Blue | 2.38 | 3.21 | 2.38 | 3.03 | 0.65 |
| Example 12 | 9.4 | 710 | 0.71 | Blue | 2.38 | 3.21 | 2.38 | 3.03 | 0.65 |

(*): Height of energy barrier making a role of confining electrons in light emitting layer Then, the results shown in Table 2 are explained.

In the organic EL elements having a two-layer structure, by comparing Comparative Example 1 with Comparative Examples 2 and 3, it is clearly shown that by doping the hole transporting layer with the acceptor, the applying voltage in a definite electric current value is lowered but the light emission efficiency is lowered.

Then, by comparing Example 1 with Comparative Example 2 and comparing Example 2 with Comparative Example 3, it can be seen that by forming the electron injection restraining layer between the hole transporting layer and the light emitting layer, lowering of the light emission efficiency can be restrained while lowering the applying voltage in a definite electric current value.

Also, in the organic EL elements having a three-layer structure, by comparing Comparative Example 4 with Comparative Example 5, it is clearly shown that by doping the hole transporting layer with the acceptor, the applying voltage in a definite electric current value is lowered but the light emission efficiency is also lowered.

Then, by comparing Example 3, Examples 9 to 11 and Example 12 with Comparative Example 5, it can be seen that by forming the electron injection restraining layer between the hole transporting layer and the light emitting layer, lowering of the light emission efficiency can be restrained while lowering the applying voltage in a definite electric current value.

Also, from Examples 3 to 5, it can be seen that as the height of the energy barrier between the electron injection retaining layer and the light emitting layer is higher, electrons can be more effectively confined, whereby the light emission efficiency becomes better.

Also, by comparing Example 4 with other examples, it can be seen that when the conditions of $|Ea^{(A)}| \geq |Ea^{(EBL)}|$ and $|Ea^{(EM)}| \geq |Ea^{(EBL)}|$ are satisfied, the light emission efficiency is more improved.

Then, by comparing Examples 6 to 8 with Example 3, it can be seen that when the film thickness of the electron injection restraining layer is thinner, the effect of doping the acceptor is more obtained without increasing the applying voltage in a definite electric current value.

(2) When the electron transporting layer is doped with a donor:

(2-1) Preparation of the organic EL element having a two-layer structure (light emitting layer+electron transporting layer):

Comparative Example 6

A transparent substrate having formed on the surface thereof an indium-tin oxide (ITO) layer having a surface resistance of 10 Ω/ and an area of 50 mm square was used, the ITO layer was patterned into stripes of 2 mm in width, after washing it with water, the substrate was subjected to pure-water ultrasonic washing for 10 minutes, acetone ultrasonic washing for 10 minutes, and isopropyl alcohol vapor washing for 5 minutes, and dried at 100° C. for one hour. Then, the substrate was fixed to a substrate holder in a resistance-heating vapor deposition apparatus and the apparatus was evacuated to a vacuum of $1\times10^{-4}$ Pa or lower. In addition, the patterned ITO layer is used as an anode.

Thereafter, as a light emitting layer, 1,1,4,4-tetraphenyl-1,3-butadiene (hereinafter, is referred to as simply TPB) shown by following structural formula (8) was laminated on the substrate at a vapor deposition rate of 0.2 nm/second such that the film thickness became 50 nm.

Then, as an electron transporting layer, 2-(4-t-butylphenyl)-5-(4-biphenylyl)-1,3,4-oxazole (hereinafter, is referred to as simply tBu-PBD) shown by following structural formula (9) was laminated on the light emitting layer at a vapor deposition rate of 0.2 nm/second such that the film thickness became 50 nm.

Finally, a cathode made of LiF—Al was formed by laminating LiF on the light emitting layer at a vapor deposition rate of 0.02 nm/second such that the film thickness became 1 nm and by laminating Al on the LiF film at a vapor deposition rate of 0.6 nm/second such that the film thickness became 100 nm.

Thus, an organic EL element composed of the anode, the light emitting layer, the electron transporting layer, and the cathode was obtained.

Structural formula (8)

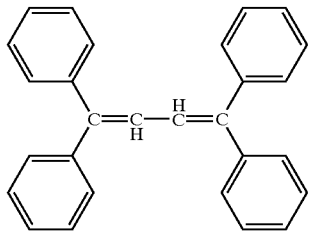

Structural formula (9)

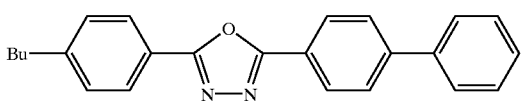

Comparative Example 7

By following the same procedure as Comparative Example 6 except that as an electron transporting layer, each of tBu-PBD and triphenylamine (hereinafter, is referred to as simply TPA) shown by following structural formula (10) was laminated at vapor deposition rates of 0.4 nm/second and 0.004 nm/second respectively such that the film thickness became 50 nm, an organic EL element-was obtained.

Structural formula (10)

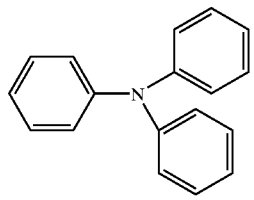

Comparative Example 8

By following the same procedure as Comparative Example 6 except that as an electron transporting layer, each of tBu-PBD and perylene shown by following structural formula (11) was laminated at vapor deposition rates of 0.4 nm/second and 0.004 nm/second respectively such that the film thickness became 50 nm, an organic EL element was obtained.

Structural formula (11)

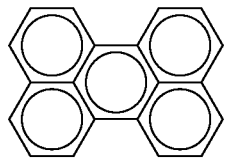

EXAMPLES 13 AND 14

By following the same procedures as Comparative Examples 7 (Example 13) and 8 (Example 14) except that between the light emitting layer and the electron transporting layer, as a hole injection restraining layer, tBu-PBD was laminated at a vapor deposition rate of 0.2 nm/second such that the film thickness became 10 nm, organic EL elements were obtained.

(2-2) Preparation of the organic EL element having a three-layer structure (hole transporting layer+light emitting layer+electron transporting layer)

Comparative Example 9

A transparent substrate having formed on the surface thereof an indium-tin oxide (ITO) layer having a surface resistance of 10 Ω/ and an area of 50 mm square was used, the ITO layer was patterned into stripes of 2 mm in width, after washing it with water, the substrate was subjected to pure-water ultrasonic washing for 10 minutes, acetone ultrasonic washing for 10 minutes, and isopropyl alcohol vapor washing for 5 minutes, and dried at 100° C. for one hour. Then, the substrate was fixed to a substrate holder in a resistance-heating vapor deposition apparatus and the apparatus was evacuated to a vacuum of $1\times10^{-4}$ Pa or lower. In addition, the patterned ITO layer is used as an anode.

Thereafter, as a hole transporting layer, NPD was laminated on the substrate at a vapor deposition rate of 0.4 nm/second such that the film thickness became 50 nm.

Then, as a light emitting layer, BAlq was laminated on the hole transporting layer at a vapor deposition rate of 0.2 nm/second such that the film thickness became 20 nm.

Then, as an electron transporting layer, $Alq_3$ was laminated on the light emitting layer at a vapor deposition rate of 0.2 nm/second such that the film thickness became 30 nm.

Finally, a cathode made of LiF—Al was formed by laminating LiF on the light emitting layer at a vapor deposition rate of 0.02 nm/second such that the film thickness became 1 nm and by laminating Al on the LiF film at a vapor deposition rate of 0.6 nm/second such that the film thickness became 100 nm.

Thus, an organic EL element composed of the anode, the hole transporting layer, the light emitting layer, the electron transporting layer, and the cathode was obtained.

Comparative Example 10

By following the same procedure as Comparative Example 9 except that as the electron transporting layer, each of $Alq_3$ and TPA was laminated at vapor deposition rates of 0.4 nm/second and 0.004 nm/second respectively such that the film thickness became 30 nm, an organic EL element was obtained.

Comparative Example 11

By following the same procedure as Comparative Example 9 except that as the electron transporting layer, each of $Alq_3$ and perylene was laminated at vapor deposition rates of 0.4 nm/second and 0.004 nm/second respectively such that the film thickness became 30 nm, an organic EL element was obtained.

Comparative Example 12

By following the same procedure as Comparative Example 9 except that as the electron transporting layer, each of $Alq_3$ and N,N'-di-(4-methyl-phenyl)-N,N'-diphenyl-1,4-phenylene-diamine (hereinafter, is referred to as simply MPPD) shown by following structural formula (12) was laminated at vapor deposition rates of 0.4 nm/second and 0.004 nm/second respectively such that the film thickness became 30 nm, an organic EL element was obtained.

Structural formula (12)

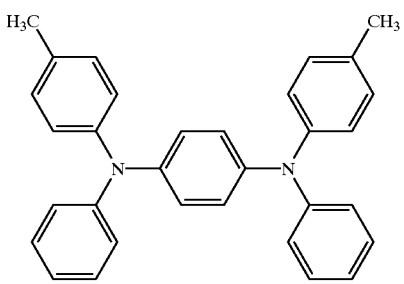

EXAMPLES 15 TO 17

By following the same procedures as Comparative Examples 10 to 12 except that between the light emitting layer and the electron transporting layer, as a hole injection restraining layer, $Alq_3$ was laminated at a vapor deposition rate of 0.2 nm/second such that the film thickness became 10 nm, organic EL elements were obtained.

EXAMPLE 18

By following the same procedure as Comparative Example 10 except that between the light emitting layer and the electron transporting layer, as a hole injection restraining layer, tBu-PBD was laminated at a vapor deposition rate of 0.2 nm/second such that the film thickness became 10 nm, an organic EL element was obtained.

EXAMPLE 19

By following the same procedure as Example 15 except that the hole injection restraining layer was laminated such that the thickness thereof became 5 nm, an organic EL element was obtained.

EXAMPLE 20

By following the same procedure as Example 15 except that the hole injection restraining layer was laminated such that the thickness thereof became 20 nm, an organic EL element was obtained.

EXAMPLE 21

By following the same procedure as Example 15 except that the hole injection restraining layer was laminated such that the thickness thereof became 30 nm, an organic EL element was obtained.

EXAMPLE 22

By following the same procedure as Example 15 except that as the electron transporting layer, each of $Alq_3$ and TPA was laminated at vapor deposition rates of 0.4 nm/second and 0.02 nm/second such that the film thickness became 30 nm an organic EL element was obtained.

EXAMPLE 23

By following the same procedure as Example 15 except that as the electron transporting layer, each of $Alq_3$ and TPA was laminated at vapor deposition rates of 0.4 nm/second and 0.04 nm/second such that the film thickness became 30 nm an organic EL element was obtained.

EXAMPLE 24

By following the same procedure as Example 15 except that as the electron transporting layer, each of $Alq_3$ and TPA was laminated at vapor deposition rates of 0.4 nm/second and 0.08 nm/second such that the film thickness became 30 nm an organic EL element was obtained.

The constructions of the organic EL elements obtained in (2-1) and (2-2) described above are shown in Table 3 below.

TABLE 3

| | Elements Constructions | | | | | | Thickness |
| | Hole transporting layer | Light emitting layer | Hole injection restraining layer | Donor | Electron transporting layer | Toner concentration (wt %) (*) | of hole injection restraining layer |
| --- | --- | --- | --- | --- | --- | --- | --- |
| Comparative Example 6 | — | TPB | — | — | tBu-PBD | — | — |
| Comparative Example 7 | — | TPB | — | TPA | tBu-PBD | 1 | — |

TABLE 3-continued

| | Elements Constructions | | | | | Thickness |
|---|---|---|---|---|---|---|
| | Hole transporting layer | Light emitting layer | Hole injection restraining layer | Donor | Electron transporting layer | Toner concentration (wt %) (*) | of hole injection restraining layer |
| Comparative Example 8 | — | TPB | — | Perylene | tBu-PBD | 1 | — |
| Example 13 | — | TPB | tBu-PBD | TPA | tBu-PBD | 1 | 10 nm |
| Example 14 | — | TPB | tBu-PBD | Perylene | tBu-PBD | 1 | 10 nm |
| Comparative Example 9 | NPD | BAlq | — | — | Alq$_3$ | — | — |
| Comparative Example 10 | NPD | BAlq | — | TPA | Alq$_3$ | 1 | — |
| Comparative Example 11 | NPD | BAlq | — | Perylene | Alq$_3$ | 1 | — |
| Comparative Example 12 | NPD | BAlq | — | MPPD | Alq$_3$ | 1 | — |
| Example 15 | NPD | BAlq | Alq$_3$ | TPA | Alq$_3$ | 1 | 10 nm |
| Example 16 | NPD | BAlq | Alq$_3$ | Perylene | Alq$_3$ | 1 | 10 nm |
| Example 17 | NPD | BAlq | Alq$_3$ | MPPD | Alq$_3$ | 1 | 10 nm |
| Example 18 | NPD | BAlq | tBu-PBD | TPA | Alq$_3$ | 1 | 10 nm |
| Example 19 | NPD | BAlq | Alq$_3$ | TPA | Alq$_3$ | 1 | 5 nm |
| Example 20 | NPD | BAlq | Alq$_3$ | TPA | Alq$_3$ | 1 | 20 nm |
| Example 21 | NPD | BAlq | Alq$_3$ | TPA | Alq$_3$ | 1 | 30 nm |
| Example 22 | NPD | BAlq | Alq$_3$ | TPA | Alq$_3$ | 5 | 10 nm |
| Example 23 | NPD | BAlq | Alq$_3$ | TPA | Alq$_3$ | 10 | 10 nm |
| Example 24 | NPD | BAlq | Alq$_3$ | TPA | Alq$_3$ | 20 | 10 nm |

(*): $\eta^{(D)}/\eta^{(ETM)}$ (2-3) Measurement of Element Characteristics

About the organic EL elements obtained as described above, the characteristics of them were measured by the same conditions as in (1-3) described above.

The results obtained are shown in Table 4 below.

TABLE 4

| | Characteristics at current density of 100 mA/cm$^2$ | | | | Ionization Potential (eV) | | | | Height of energy barrier (eV) (*) |
|---|---|---|---|---|---|---|---|---|---|
| | Voltage (V) | Luminance (cd/m$^2$) | Efficiency (cd/A) | Emitted color | Light emitting material | Hole injection restraining layer | Donor | Electron transporting material | |
| Comparative Example 6 | 14.0 | 410 | 0.41 | Blue | 5.69 | — | — | 5.89 | 0.20 |

TABLE 4-continued

| | Characteristics at current density of 100 mA/cm² | | | Ionization Potential (eV) | | | | Height of energy barrier (eV) (*) |
|---|---|---|---|---|---|---|---|---|
| | Voltage (V) | Luminance (cd/m²) | Efficiency (cd/A) | Emitted color | Light emitting material | Hole injection restraining layer | Donor | Electron transporting material | |
| Comparative Example 7 | 9.2 | 100 | 0.10 | Blue | 5.69 | — | 5.52 | 5.89 | −0.17 |
| Comparative Example 8 | 10.1 | 91 | 0.09 | Blue | 5.69 | — | 5.35 | 5.89 | −0.34 |
| Example 13 | 10.4 | 360 | 0.36 | Blue | 5.69 | 5.89 | 5.52 | 5.89 | 0.20 |
| Example 14 | 11.0 | 300 | 0.30 | Blue | 5.69 | 5.89 | 5.35 | 5.89 | 0.20 |
| Comparative Example 9 | 13.0 | 1000 | 1.0 | Blue | 5.64 | — | — | 5.70 | 0.06 |
| Comparative Example 10 | 6.4 | 420 | 0.42 | Blue | 5.64 | — | 5.52 | 5.70 | −0.12 |
| Comparative Example 11 | 7.3 | 210 | 0.21 | Blue | 5.64 | — | 5.35 | 5.70 | −0.29 |
| Comparative Example 12 | 6.5 | 440 | 0.44 | Blue | 5.64 | — | 5.41 | 5.70 | −0.23 |
| Example 15 | 6.7 | 870 | 0.87 | Blue | 5.64 | 5.70 | 5.52 | 5.70 | 0.06 |
| Example 16 | 7.9 | 610 | 0.61 | Blue | 5.64 | 5.70 | 5.35 | 5.70 | 0.06 |
| Example 17 | 7.0 | 920 | 0.92 | Blue | 5.64 | 5.70 | 5.41 | 5.70 | 0.06 |
| Example 18 | 7.0 | 960 | 0.96 | Blue | 5.64 | 5.89 | 5.52 | 5.70 | 0.25 |
| Example 19 | 6.2 | 860 | 0.86 | Blue | *5.64 | 5.70 | 5.52 | 5.70 | 0.06 |
| Example 20 | 10.9 | 900 | 0.90 | Blue | 5.64 | 5.70 | 5.52 | 5.70 | 0.06 |
| Example 21 | 12.8 | 940 | 0.94 | Blue | 5.64 | 5.70 | 5.52 | 5.70 | 0.06 |
| Example 22 | 6.5 | 840 | 0.84 | Blue | 5.64 | 5.70 | 5.52 | 5.70 | 0.06 |
| Example 23 | 6.3 | 820 | 0.82 | Blue | 5.64 | 5.70 | 5.52 | 5.70 | 0.06 |
| Example 24 | 6.0 | 830 | 0.83 | Blue | 5.64 | 5.70 | 5.52 | 5.70 | 0.06 |

(*)Height of the energy barrier making a role of confining holes in light emitting layer.

The results shown in Table 4 are explained.

In the organic EL elements having a two-layer structure, by comparing Comparative Example 6 with Comparative Examples 7 and 8, it is clearly shown that by doping the electron transporting layer with the donor, the applying voltage in a definite electric current value is lowered but the light emission efficiency is lowered.

Then, by comparing Example 13 with Comparative Example 7 and comparing Example 14 with Comparative Example 8, it can be seen that by forming the hole injection restraining layer between the light emitting layer and the electron transporting layer, lowering of the light emission efficiency can be restrained while lowering the applying voltage in a definite electric current value.

Also, in the organic EL elements having a three-layer structure, by comparing Comparative Example 9 with Comparative Examples 10 to 12, it is clearly shown that by doping the electron transporting layer with the donor, the applying voltage in a definite electric current value is lowered but the light emission efficiency is also lowered.

Then, by comparing Example 15 with Comparative Example 10, comparing Example 16 with Comparative Example 11, and comparing Example 17 with Comparison Example 12 and Examples 22 to 24, it can be seen that by forming the hole injection restraining layer between the light emitting layer and the electron transporting layer, lowering of the light emission efficiency can be restrained while lowering the applying voltage in a definite electric current value.

Also, from Example 15 and Example 18, it can be seen that as the height of the energy barrier between the hole injection restraining layer and the light emitting layer is higher, holes can be more effectively confined, whereby the light emission efficiency becomes better.

Then, by comparing Examples 19 to 21 with Example 15, it can be seen that when the film thickness of the hole injection restraining layer is thinner, the effect of doping the donor is more obtained without increasing the applying voltage in a definite electric current value.

(3) When the hole transporting layer is doped with an acceptor and the electron transporting layer is doped with a donor:

(3-1) Preparation of the organic EL element having a three-layer structure (hole transporting layer+light emitting layer+electron transporting layer):

Comparison Example 13

A transparent substrate having formed on the surface thereof an indium-tin oxide (ITO) layer having a surface resistance of 10 Ω/ and an area of 50 mm square was used, the ITO layer was patterned into stripes of 2 mm in width, after washing it with water, the substrate was subjected to pure-water ultrasonic washing for 10 minutes, acetone ultrasonic washing for 10 minutes, and isopropyl alcohol vapor washing for 5 minutes, and dried at 100° C. for one hour. Then, the substrate was fixed to a substrate holder in a resistance-heating vapor deposition apparatus and the apparatus was evacuated to a vacuum of $1 \times 10^{-4}$ Pa or lower. In addition, the patterned ITO layer is used as an anode.

Thereafter, as a hole transporting layer, each of NPD and TCNQ was laminated on the substrate at vapor deposition rates of 0.4 nm/second and 0.004 nm/second respectively such that the film thickness became 50 nm.

Then, as a light emitting layer, BAlq was laminated on the hole transporting layer at a vapor deposition rate of 0.2 nm/second such that the film thickness became 20 nm.

Then, as an electron transporting layer, each of $Alq_3$ and TPA was laminated on the light emitting layer at vapor deposition rates of 0.4 nm/second and 0.004 nm/second respectively such that the film thickness became 30 nm.

Finally, a cathode made of LIF—Al was formed by laminating LiF on the light emitting layer at a vapor deposition rate of 0.02 nm/second such that the film thickness became 1 nm and by laminating Al on the LiF film at a vapor deposition rate of 0.6 nm/second such that the film thickness became 100 nm.

Thus, an organic EL element composed of the anode, the hole transporting layer, the light emitting layer, the electron transporting layer, and the cathode was obtained.

EXAMPLE 25

By following the same procedure as Comparative Example 13 except that between the hole transporting layer and the light emitting layer, as an electron injection restraining layer, NPD was laminated at a vapor deposition rate of 0.2 nm/second such that the film thickness became 10 nm, and between the light emitting layer and the electron transporting layer, as a hole injection restraining layer, $Alq_3$ was laminated at a vapor deposition rate of 0.2 nm/second such the film thickness became 10 nm, an organic EL element was obtained.

EXAMPLE 26

By following the same procedure as Comparative Example 13 except that between the hole transporting layer and the light emitting layer, as an electron injection restraining layer, MTDATA was laminated at a vapor deposition rate of 0.2 nm/second such that the film thickness became 10 nm, and between the light emitting layer and the electron transporting layer, as a hole injection restraining layer, tBu-PBD was laminated at a vapor deposition rate of 0.2 nm/second such that the film thickness became 10 nm, an organic EL element was obtained.

EXAMPLE 27

By following the same procedure as Example 25 except that as the hole transporting layer, each of NPD and HCNB was laminated at vapor deposition rates of 0.4 nm/second and 0.004 nm/second respectively such that the film thickness became 50 nm and as the electron transporting layer, each of $Alq_3$ and perylene was laminated at vapor deposition rates of 0.4 nm/second and 0.004 nm/second respectively such that the film thickness became 30 nm, an organic EL element was obtained.

The constructions of the organic EL elements obtained in (3-1) described above are shown in Table 5 below.

TABLE 5

| | Element Construction | | | | | | | Thickness of | | Thickness |
| --- | --- | --- | --- | --- | --- | --- | --- | --- | --- | --- |
| | Hole transporting layer | Acceptor | Electron injection restraining layer | Light emitting layer | Hole injection restraining layer | Donor | Electron transporting layer | Acceptor concentration (WT. %) (*1) | electron injection restraining layer | Donor concentration (wt. %) (*2) | of hole injection restraining layer |
| Comparative Example 13 | NPD | TCNQ | — | BAlq | — | TPA | $Alq_3$ | 1 | — | 1 | — |
| Example 25 | NPD | TCNQ | NPD | BAlq | $Alq_3$ | TPA | $Alq^3$ | 1 | 10 nm | 1 | 10 nm |
| Example 26 | NPD | TCNQ | MIDATA | BAlq | tBu-PBD | TPA | $Alq^3$ | 1 | 10 nm | 1 | 10 nm |
| Example 27 | NPD | HCNB | MIDATA | BAlq | tBu-PBD | Perylene | $Alq_3$ | 1 | 10 nm | 1 | 10 nm |

(*1): $\eta^{(A)}/\eta^{(HTM)}$
(*2): $\eta^{(D)}/\eta^{(ETM)}$ (3-2) Measurement of Element Characteristics About the organic EL elements obtained as described above, the characteristics of them were measured under the same conditions as in (1-3).

The results obtained are shown in Table 6.

$|Ea^{(A)}| \leq |Ea^{(EBL)}|$ and $|Ea^{(EM)}| \leq |Ea^{(EBL)}|$ wherein $Ea^{(A)}$ represents the electron affinity of the acceptor, $Ea^{(EBL)}$ represents the electron affinity of a material of the electron injection restraining layer, and

TABLE 6

| | Characteristics at current density of 100 mA/cm² | | | | Electron Affinity (eV) | | Height of energy barrier (eV) (*1) | Ionization Potential (eV) | | | Height of energy barrier (eV) (*2) |
|---|---|---|---|---|---|---|---|---|---|---|---|
| | Voltage (V) | Luminance (cd/m²) | Efficiency (cd/A) | Emitted color | Acceptor | Electron injection restraining layer | Light emitting material | Light emitting material | Hole injection restraining layer | Donor | |
| Comparative Example 13 | 4.0 | 360 | 0.38 | Blue | 3.21 | — | 3.03 | −0.18 | 5.64 | — | 5.52 | −0.12 |
| Example 25 | 4.5 | 820 | 0.82 | Blue | 3.21 | 2.38 | 3.03 | 0.65 | 5.64 | 5.70 | 5.52 | 0.06 |
| Example 26 | 4.4 | 870 | 0.87 | Blue | 3.21 | 2.11 | 3.03 | 0.92 | 5.64 | 5.89 | 5.52 | 0.25 |
| Example 27 | 4.7 | 600 | 0.60 | Blue | 3.11 | 2.11 | 3.03 | 0.92 | 5.64 | 5.89 | 5.35 | 0.25 |

(*1): Height of the energy barrier making a role confining electrons in light emitting layer
(*2): Height of the energy barrier making a role confining holes in light emitting layer The results shown in Table 6 are explained.

In the organic EL elements having three-layer structure, by comparing Examples 25 to 27 with Comparative Example 13, it can be seen that by forming the electron injection restraining layer between the hole transporting layer and the light emitting layer and by forming the hole injection restraining layer between the light emitting layer and the electron transporting layer, lowering of the light emission efficiency can be restrained while lowering the applying voltage in a definite electric current value.

As described above in detail, according to the present invention, by forming the electron injection restraining layer between the light emitting layer and the hole transporting layer doped with the acceptor, or by forming the hole injection restraining layer between the light emitting layer and the electron transporting layer doped with the donor, or by forming both the electron injection restraining layer and the hole injection restraining layer, an organic EL element having excellent electric characteristics (low resistance and high light emission efficiency) and the excellent rectification characteristics (the leak current under a reverse bias is small) can be obtained.

What is claimed is:

1. An organic electroluminescent element comprising at least a light emitting layer containing an organic light emitting material placed between an anode and a cathode, wherein the element comprises:
   (i) between the anode and the light emitting layer, at least a hole transporting layer containing a hole transporting material and an acceptor, and an electron injection restraining layer restraining the injection of electrons from the light emitting layer into the hole transporting layer, from the anode side, and/or (ii) between the light emitting layer and the cathode, at least an electron transporting layer containing an electron transporting material and a donor, and a hole injection restraining layer restraining the injection of holes from the light emitting layer into the electron transporting layer, from the cathode side; and
   wherein the electron injection restraining layer and the light emitting layer are constituted by materials meeting the following formula $Ea^{(EM)}$ represents the electron affinity of a material of the light emitting layer.

2. An organic electroluminescent element according to claim 1 wherein the hole injection restraining layer and the light emitting layer are constituted by materials meeting the following formula (2)

$$|Ip^{(D)}| \leq |Ip^{(HBL)}| \text{ and } |Ip^{(EM)}| \leq |Ip^{(HBL)}| \quad (2)$$

wherein, $Ip^{(D)}$ represents the ionization potential of a donor, $Ip^{(HBL)}$ represents the ionization potential of a material constituting the hole injection restraining layer, and $Ip^{(EM)}$ represents the ionization potential of a material constituting the light emitting layer.

3. An organic electroluminescent element according to claim 1 wherein the electron injection restraining layer is constituted by the hole transporting material.

4. An organic electroluminescent element according to claim 1 wherein the hole injection restraining layer is constituted by the electron transporting material.

5. An organic electroluminescent element according to claim 1 wherein the thickness of the electron injection restraining layer is thinner than 30 nm.

6. An organic electroluminescent element according to claim 1 wherein the thickness of the hole injection restraining layer is thinner than 30 nm.

7. An organic electroluminescent element according to claim 1 wherein the acceptor is a compound having a cyano group.

8. An organic electroluminescent element according to claim 1 wherein the donor is a compound having an aromatic tertiary amine as the skeleton or a condensed polycyclic compound.

9. An organic electroluminescent element according to claim 1 wherein the organic electroluminescent element arrangement is selected from at least one of the following:
   (1) anode/hole transporting layer/electron injection restraining layer/light emitting layer/cathode,
   (2) anode/hole transporting layer/electron injection restraining layer/light emitting layer/electron transporting layer/cathode, (3) anode/light emitting layer/hole injection restraining layer/electron transporting layer/cathode, (4) anode/hole transporting layer/light emitting layer/hole injection restraining layer/electron transporting layer/cathode, or (5) anode/hole transporting layer/electron injection restraining layer/light emitting layer/hole injection restraining layer/electron transporting layer/cathode.

10. A method of producing the organic electroluminescent element described in claim 1 comprising forming each of the anode, the hole transporting layer, the electron injection restraining layer, the light emitting layer, the hole injection restraining layer, the electron transporting layer, and the cathode by a vacuum film-forming method.

11. The element of claim 1, wherein the electron injection restraining layer or hole injection restraining layer comprises one of: N,N'-di(naphthylene-1-yl)-N,N'-bidiphenyl-benzidine; N,N'-bis-(3-methylphenyl)-N,N'-bis-(phenyl)-benzidine; a quinacridone base compound; a phthalocyanine base compound; polyvinyl carbazole; poly-p-phenylenevinylene; and polysilane.

12. An organic electroluminescent element comprising at least a light emitting layer containing an organic light emitting material placed between an anode and a cathode, wherein the element comprises:

(i) between the anode and the light emitting layer, at least a hole transporting layer containing a hole transporting material and an acceptor, and an electron injection restraining layer restraining the injection of electrons from the light emitting layer into the hole transporting layer, from the anode side, and/or (ii) between the light emitting layer and the cathode, at least an electron transporting layer containing an electron transporting material and a donor, and a hole injection restraining layer restraining the injection of holes from the light emitting layer into the electron transporting layer, from the cathode side;

wherein the electron injection restraining layer and the light emitting layer are constituted by materials meeting the following formula $$|Ea^{(A)}||Ea^{(EBL)}| \text{ and } |Ea^{(EM)}||Ea^{(EBL)}|$$

wherein $Ea^{(A)}$ represents the electron affinity of the acceptor, $Ea^{(EBL)}$ represents the electron affinity of a material of the electron injection restraining layer, and $Ea^{(EM)}$ represents the electron affinity of a material of the light emitting layer; and wherein the hole injection restraining layer and the light emitting layer comprise materials meeting the following formula:

$$|Ip^{(D)}||Ip^{(HBL)}| \text{ and } |Ip^{(EM)}||Ip^{(HBL)}|$$

where $Ip^{(D)}$ represents the ionization potential of a donor, $Ip^{(HBL)}$ represents the ionization potential of a material of the hole injection restraining layer, and $Ip^{(EM)}$ represents the ionization potential of a material of the light emitting layer.

13. An organic electroluminescent element comprising at least a light emitting layer containing an organic light emitting material placed between an anode and a cathode, wherein the element comprises:

(i) between the anode and the light emitting layer, at least a hole transporting layer containing a hole transporting material and an acceptor, and an electron injection restraining layer restraining the injection of electrons from the light emitting layer into the hole transporting layer, from the anode side, and/or (ii) between the light emitting layer and the cathode, at least an electron transporting layer containing an electron transporting material and a donor, and a hole injection restraining layer restraining the injection of holes from the light emitting layer into the electron transporting layer, from the cathode side;

wherein the hole injection restraining layer and the light emitting layer comprise materials meeting the following formula:

$$|Ip^{(D)}||Ip^{(HBL)}| \text{ and } |Ip^{(EM)}||Ip^{(HBL)}|$$

where $Ip^{(D)}$ represents the ionization potential of a donor, $Ip^{(HBL)}$ represents the ionization potential of a material of the hole injection restraining layer, and $Ip^{(EM)}$ represents the ionization potential of a material of the light emitting layer.

* * * * *

(12) EX PARTE REEXAMINATION CERTIFICATE (6969th)
United States Patent
Fujita et al.

(10) Number: US 6,566,807 C1
(45) Certificate Issued: Aug. 4, 2009

(54) ORGANIC ELECTROLUMINESCENT ELEMENT AND PRODUCTION METHOD THEREOF

(75) Inventors: Yoshimasa Fujita, Kashihara (JP); Takashi Ogura, Nara (JP); Akihiko Kouno, Yao (JP)

(73) Assignee: Sharp Kabushiki Kaisha, Abeno-Ku, Osaka (JP)

Reexamination Request:
No. 90/008,929, Dec. 27, 2007

Reexamination Certificate for:
Patent No.: 6,566,807
Issued: May 20, 2003
Appl. No.: 09/472,018
Filed: Dec. 27, 1999

(51) Int. Cl.
*H01L 51/50* (2006.01)
*H01L 51/05* (2006.01)
*H01L 51/30* (2006.01)

(52) U.S. Cl. .................. 313/506; 313/504; 428/690; 428/917; 445/24

(58) Field of Classification Search .................. 313/506
See application file for complete search history.

(56) References Cited

U.S. PATENT DOCUMENTS 5,093,698 A * 3/1992 Egusa
5,674,597 A * 10/1997 Fujii et al.

OTHER PUBLICATIONS

Blochwitz, J., et al., "Low Voltage Organic Light Emitting Diodes Featuring Doped Phthalocyanine as Hole Transport Material", *Appl. Phys. Lett.*, vol. 73, No. 6, (1988),729–731.*

Mori, T., et al., "Electrical and Luminescent Properties of Color–Changeable Organic Electroluminescent Diode Using Squarylium Dyes", *Jpn. J. Appl. Phys.* vol. 33, Pt. 1, No. 12A, (1994),6594–6598.*

Pfeiffer, M., et al., "Controlled Doping of Phthalocyanine Layers by Cosublimation with Acceptor Molecules: A Systematic Seebeck and Conductivity Study", *Appl. Phys. Lett.* vol. 73, No. 22, (1998),3202–3204.*

* cited by examiner

*Primary Examiner*—Fred Ferris

(57) ABSTRACT

An organic electroluminescent element comprising at least a light emitting layer containing an organic light emitting material placed between an anode and a cathode, wherein the element has, between the anode and the light emitting layer, at least a hole transporting layer containing a hole transporting material and an acceptor, and an electron injection restraining layer restraining the injection of electrons from the light emitting layer into the hole transporting layer, from the anode side, and/or, between the light emitting layer and the cathode, at least an electron transporting layer containing an electron transporting material and a donor, and a hole injection restraining layer restraining the injection of holes from the light emitting layer into the electron transporting layer, from the cathode side.

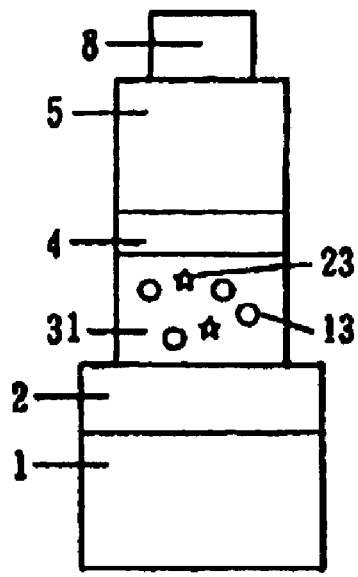

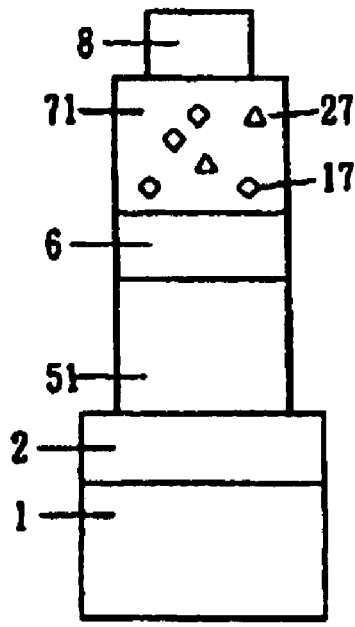

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–13 are cancelled.

New claims 14–22 are added and determined to be patentable.

*14. An organic electroluminescent element comprising at least a light emitting layer containing an organic light emitting material placed between an anode and a cathode, wherein the element comprises:*
  *(i) between the anode and the light emitting layer, at least a hole transporting layer containing a hole transporting material and an acceptor, and an electron injection restraining layer restraining the injection of electrons from the light emitting layer into the hole transporting layer, from the anode side, and/or (ii) between the light emitting layer and the cathode, at least an electron transporting layer containing an electron transporting material and a donor, and a hole injection restraining layer restraining the injection of holes from the light emitting layer into the electron transporting layer, from the cathode side; and*
  *wherein the electron injection restraining layer and the light emitting layer are constituted by materials meeting the following formulas:*

$$if\ |Ea^{(EM)}|>|Ea^{(A)}|\ then\ |Ea^{(A)}|\geq|Ea^{(EBL)}|,$$

$$if\ |Ea^{(EM)}|<|Ea^{(A)}|\ then\ |Ea^{(EM)}|\geq|Ea^{(EBL)}|,\ and$$

$$if\ |Ea^{(EM)}|=|Ea^{(A)}|\ then\ |Ea^{(A)}|\geq|Ea^{(EBL)}|\ and\ |Ea^{(EM)}|\geq|Ea^{(EBL)}|$$

*wherein $Ea^{(A)}$ represents the electron affinity of the acceptor, $Ea^{(EBL)}$ represents the electron affinity of a material of the electron injection restraining layer, and $Ea^{(EM)}$ represents the electron affinity of a material of the light emitting layer,*

*wherein the hole injection restraining layer and the light emitting layer comprise materials meeting the following formulas:*

$$if\ |Ip^{(D)}|>|Ip^{(EM)}|\ then\ |Ip^{(D)}|\leq|Ip^{(HBL)}|,$$

$$if\ |Ip^{(D)}|<|Ip^{(EM)}|\ then\ |Ip^{(EM)}|\leq|Ip^{(HBL)}|,and$$

$$if\ |Ip^{(D)}|=|Ip^{(EM)}|\ then\ |Ip^{(D)}|\leq|Ip^{(HBL)}|\ and\ |Ip^{(EM)}|\leq|Ip^{(HBL)}|$$

*where $Ip^{(D)}$ represents the ionization potential of a donor, $Ip^{(HBL)}$ represents the ionization potential of a material of the hole injection restraining layer, and $Ip^{(EM)}$ represents the ionization potential of a material of the light emitting layer, and wherein*
  *the organic electroluminescent element comprises anode/ light emitting layer/hole injection restraining layer/ electron transporting layer/cathode.*

*15. The organic electroluminescent element according to claim 14, wherein the electron injection restraining layer is constituted by the hole transporting material.*

*16. The organic electroluminescent element according to claim 14 wherein the hole injection restraining layer is constituted by the electron transporting material.*

*17. The organic electroluminescent element according to claim 14 wherein the thickness of the electron injection restraining layer is thinner than 30 nm.*

*18. The organic electroluminescent element according to claim 14 wherein the thickness of the hole injection restraining layer is thinner than 30 nm.*

*19. The organic electroluminescent element according to claim 14 wherein the acceptor is a compound having a cyano group.*

*20. The organic electroluminescent element according to claim 14 wherein the donor is a compound having an aromatic tertiary amine as the skeleton or a condensed polycyclic compound.*

*21. A method of producing the organic electroluminescent element described in claim 14 comprising forming each of the anode, the hole transporting layer, the electron injection restraining layer, the light emitting layer, the hole injection restraining layer, the electron transporting layer, and the cathode by a vacuum film-forming method.*

*22. The organic electroluminescent element of claim 14, wherein the electron injection restraining layer or hole injection restraining layer comprises one of: N,N'-di (naphthylene-1-yl)-N,N'-bidiphenyl-benzidine; N,N'-bis-(3-methylphenyl)-N,N'-bis-(phenyl)-benzidine; a quinacridone base compound; a phthalocyanine base compound; polyvinyl carbazole; poly-p-phenylenevinylene; and polysilane.*

\* \* \* \* \*

(12) EX PARTE REEXAMINATION CERTIFICATE (8394th)
United States Patent
Fujita et al.

(10) Number: US 6,566,807 C2
(45) Certificate Issued: Jul. 5, 2011

(54) ORGANIC ELECTROLUMINESCENT ELEMENT AND PRODUCTION METHOD THEREOF

(75) Inventors: Yoshimasa Fujita, Kashihara (JP); Takashi Ogura, Nara (JP); Akihiko Kouno, Yao (JP)

(73) Assignee: Sharp Kabushiki Kaisha, Osaka (JP)

Reexamination Request:
No. 90/011,327, Dec. 13, 2010

Reexamination Certificate for:
Patent No.: 6,566,807
Issued: May 20, 2003
Appl. No.: 09/472,018
Filed: Dec. 27, 1999

Reexamination Certificate C1 6,566,807 issued Aug. 4, 2009

(30) Foreign Application Priority Data

Dec. 28, 1998 (JP) .......................................... 10-373865

(51) Int. Cl.
| | |
|---|---|
| *H01L 33/00* | (2006.01) |
| *H01L 51/00* | (2006.01) |
| *H01L 51/30* | (2006.01) |
| *H01L 51/50* | (2006.01) |
| *H01L 51/05* | (2006.01) |
| *H05B 33/10* | (2006.01) |
| *H05B 33/12* | (2006.01) |
| *H05B 33/14* | (2006.01) |
| *H05B 33/22* | (2006.01) |

(52) U.S. Cl. ...................... 313/506; 313/504; 426/690; 426/917; 445/24

(58) Field of Classification Search ........................ None
See application file for complete search history.

(56) References Cited

U.S. PATENT DOCUMENTS 6,783,849 B2  8/2004  Yitzchaik .................... 428/339

FOREIGN PATENT DOCUMENTS

| | | |
|---|---|---|
| JP | 04-297076 | 10/1992 |
| WO | WO 9720355 | 6/1997 |

OTHER PUBLICATIONS

Zhao et al. "Charge transfer at n–doped organic–organic heterojunctions" Journal of Applied Physics 105 (2009), article No. 123711 (5 pages).

Kampen et al. "Electronic properties of interfaces between parylene derivatives and GaAs(001) surfaces" J. Phys.: Condensed Matter 15 (2003) p. S2679–S2692.

"Ionization Energies of Atoms and Atomic Ions", CRC Handbook of Chemistry and Physics, 91st Edition (Internet Version 2011), W. M. Haynes, ed., CRC Press/Taylor and Francis, Boca Raton, FL, pp. 10–203 to 10–205.

"Electron Affinities", CRC Handbook of Chemistry and Physics, 91st Edition (Internet Version 2011), W. M. Haynes, ed., CRC Press/Taylor and Francis, Boca Raton, FL, pp. 10–147 to 10–166.

Kido, et al., Jpn. J. Appl. Phys. vol. 32 (1993) pp. L917–L920.

Kido, et al., Appl. Phys. Lett. 64(7)(Feb. 14, 1994) pp. 815–817.

(Continued)

*Primary Examiner*—Erik Kielin

(57) ABSTRACT

An organic electroluminescent element comprising at least a light emitting layer containing an organic light emitting material placed between an anode and a cathode, wherein the element has, between the anode and the light emitting layer, at least a hole transporting layer containing a hole transporting material and an acceptor, and an electron injection restraining layer restraining the injection of electrons from the light emitting layer into the hold transporting layer, from the anode side, and/or, between the light emitting layer and the cathode, at least an electron transporting layer containing an electron transporting material and a donor, and a hole injection restraining layer restraining the injection of holes from the light emitting layer into the electron transporting layer, from the cathode side.

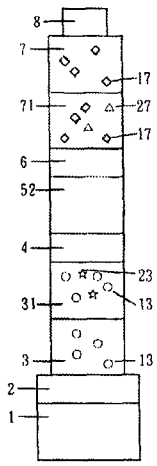

OTHER PUBLICATIONS

Blochwitz, et al., Appl. Phys. Lett., vol. 73, No. 6 (Aug. 10, 1998), pp. 729–731.

Mori, et al., Jpn. J. Appl. .Phys. vol. 33 (1994) pp. 6594–6598.

Tada, et al., IEEE Journal of Selected Topics in Quantum Electronics, vol. 4, No. 1, (Jan./Feb. 1998).

Tian, et al., Chin.Phys.Lett., vol. 13, No. 10 (1996) 790.

JP Laid–Open Patent Application No. 04–297076 (English language translation).

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 14-22 is confirmed.

Claims 1-13 were previously cancelled.

\* \* \* \* \*